US012812801B2

(12) United States Patent
Kwon et al.

(10) Patent No.: US 12,812,801 B2
(45) Date of Patent: Nov. 24, 2026

(54) DISPLAY DEVICE

(71) Applicant: LG ELECTRONICS INC., Seoul (KR)

(72) Inventors: Hyeongjun Kwon, Seoul (KR); Sanghoon Kim, Seoul (KR); Jonghwan Lee, Seoul (KR); Hyoungjik Cha, Gyeongsangbuk-do (KR)

(73) Assignee: LG ELECTRONICS INC., Seoul (KR)

( * ) Notice: Subject to any disclaimer, the term of this patent is extended or adjusted under 35 U.S.C. 154(b) by 74 days.

(21) Appl. No.: 18/914,536

(22) Filed: Oct. 14, 2024

(65) Prior Publication Data

US 2025/0126731 A1 Apr. 17, 2025

(30) Foreign Application Priority Data

Oct. 16, 2023 (KR) ........................ 10-2023-0137440

(51) Int. Cl.
*H05K 5/02* (2006.01)

(52) U.S. Cl.
CPC .................................. *H05K 5/0234* (2013.01)

(58) Field of Classification Search
CPC ........ F16M 11/06; F16M 11/22; F16M 11/38; F16M 13/022; F16M 2200/08; G06F 1/1601; G06F 1/1607; G06F 1/181
See application file for complete search history.

(56) References Cited

U.S. PATENT DOCUMENTS

| | | | | |
|---|---|---|---|---|
| 2013/0163197 A1 | 6/2013 | Mack et al. | | |
| 2017/0292302 A1* | 10/2017 | Tomky | ................ | F16M 13/005 |
| 2022/0413550 A1* | 12/2022 | Huang | ................. | G06F 1/1607 |

FOREIGN PATENT DOCUMENTS

| | | |
|---|---|---|
| KR | 1020100132332 | 12/2010 |
| KR | 1020180043607 | 4/2018 |
| WO | 2021206223 | 10/2021 |

OTHER PUBLICATIONS

Korean Intellectual Property Office Application No. 10-2023-0137440, Office Action dated Apr. 17, 2025, 5 pages.
Korean Intellectual Property Office Application No. 10-2025-0193933, Office Action dated Jan. 13, 2026, 6 pages.

* cited by examiner

*Primary Examiner* — Robin J Mishler
(74) *Attorney, Agent, or Firm* — LEE, HONG, DEGERMAN, KANG & WAIMEY

(57) ABSTRACT

A display device having a back cover coupled to a display panel and a stand cover rotatably coupled to the back cover. The device also includes an elastic member that extends in a direction that intersects the rotation axis of the stand cover. A follower shaft is coupled to the elastic member and is structured to be movable in a longitudinal direction. The stand cover includes a shaft extending toward the rotation axis and is structured to rotate about the rotation axis, and a cam integrally rotating with the shaft to move the follower shaft. The cam includes a ramp that contacts the follower shaft, and the ramp includes a nose protruding in a direction intersecting the rotation axis, where a distance between the nose and the rotation axis increases and then decreases as the stand cover is rotated about the rotation axis.

15 Claims, 21 Drawing Sheets

DISPLAY DEVICE

CROSS-REFERENCE TO RELATED APPLICATIONS

Pursuant to 35 U.S.C. § 119 (a), this application claims the benefit of earlier filing date and right of priority to Korean Patent Application No. 10-2023-0137440, filed on Oct. 16, 2023, the contents of which are all hereby incorporated by reference herein in their entirety.

BACKGROUND OF THE INVENTION

Field of the Invention

The present disclosure relates to a display device, and more particularly to a display device capable of standing upright.

Description of the Related Art

With the development of the information society, there have been growing demands for various types of display devices, and in order to meet these demands, various display devices, such as a liquid crystal display (LCD) device, a Plasma Display Panel (PDP), an electroluminescent display (ELD), a vacuum fluorescent display (VFD), an organic light emitting diode (OLED), etc., have been studied and used recently.

Particularly, there is a growing consumer interest in portable display devices that can be used in various places and circumstances. Accordingly, many studies are conducted on structural characteristics of a display device capable of allowing users to easily mount the display device at a comfortable angle for viewing.

SUMMARY OF THE INVENTION

It is an object of the present disclosure to solve the above and other problems.

Another objective of the present disclosure may be to provide a structure for mounting a display panel.

Another objective of the present disclosure may be to provide a mounting structure that is folded or unfolded with a minimum driving force.

Another objective of the present disclosure may be to provide a mounting structure that is folded or unfolded semi-automatically.

Another objective of the present disclosure may be to provide a mounting structure capable of maintaining a folded or unfolded state of a stand cover.

Another objective of the present disclosure may be to provide a structure for tilting a display panel at various mounting angles.

Another objective of the present disclosure may be to provide a structure for tilting a display panel at a comfortable angle for viewing.

Another objective of the present disclosure may be to provide a display device with improved convenience of portability.

Another objective of the present disclosure may be to provide a mounting structure of a display panel with improved convenience of installation.

Another objective of the present disclosure may be to improve noise and/or vibration caused when a mounting structure is driven.

In order to accomplish the above and other objects, a display device according to one aspect of the present disclosure may include a display panel; a back cover disposed at a rear of the display panel and coupled to the display panel; a stand cover rotatably coupled to the back cover; an elastic member extending in a direction intersecting a rotation axis of the stand cover, and having one end fixed to the back cover; and a follower shaft fixed to the other end of the elastic member and movable in a longitudinal direction of the elastic member, wherein the stand cover may include: a shaft extending toward the rotation axis and rotating about the rotation axis; and a cam integrally rotating with the shaft to move the follower shaft, the cam including a ramp that contacts the follower shaft, wherein the ramp may include a nose protruding from the shaft in a direction intersecting the rotation axis, with a distance between the nose and the rotation axis increasing and then decreasing in a rotation direction of the rotation axis, such that the cam may expand the elastic member, connected to the follower shaft, by rotation of the stand cover.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION

Figure 1:
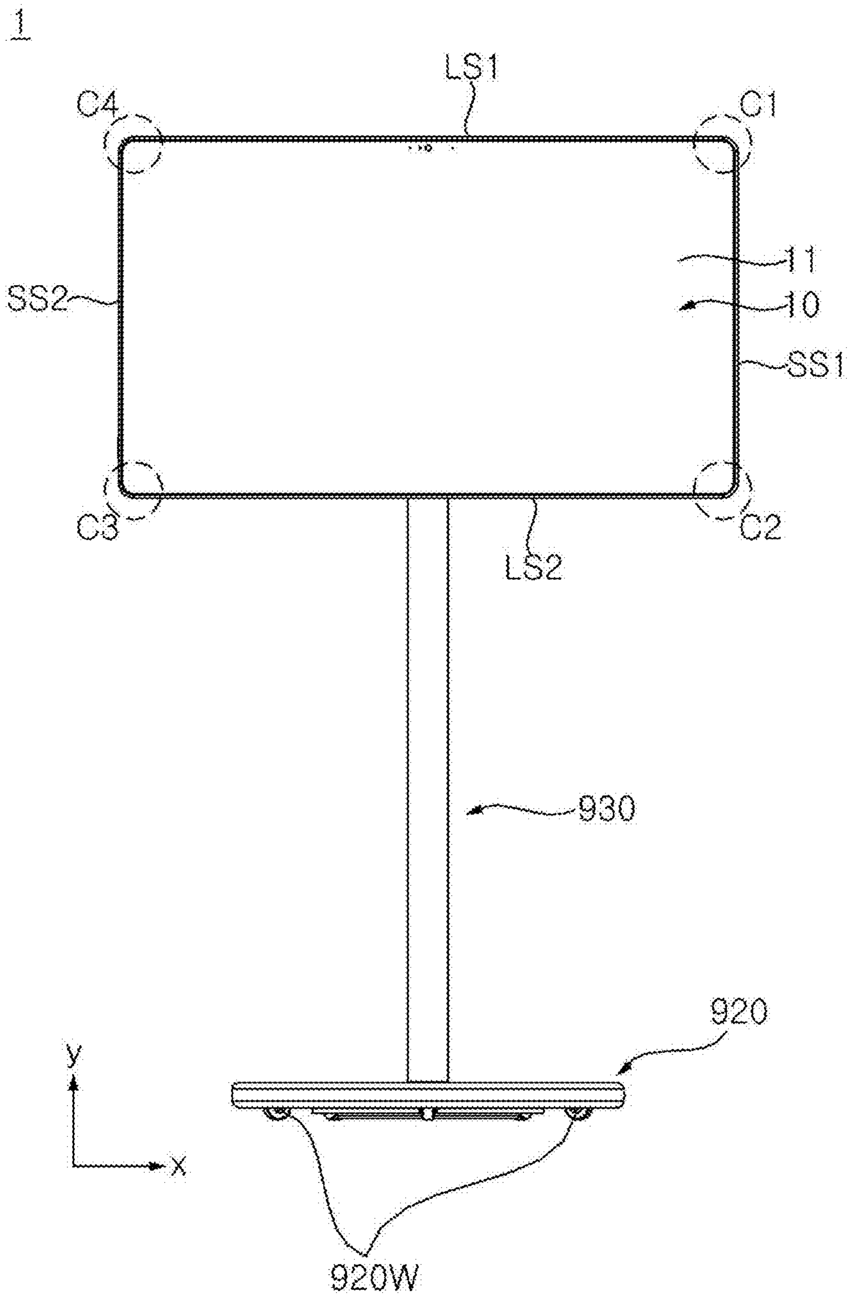
FIGS. 1 to 21 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the case of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

It should be understood that the terms "comprise," "include," "have," etc. when used in this specification, specify the presence of stated features, integers, steps, operations, elements, components, or combinations thereof but do not preclude the presence or addition of one or more other features, integers, steps, operations, elements, components, or combinations thereof.

References to directions, such as up (U), down (D), left (Le), right (Ri), front (F), and rear (R), shown in the drawings are provided merely for convenience of explanation and are not intended for limiting the scope of the present disclosure.

Figure 2:
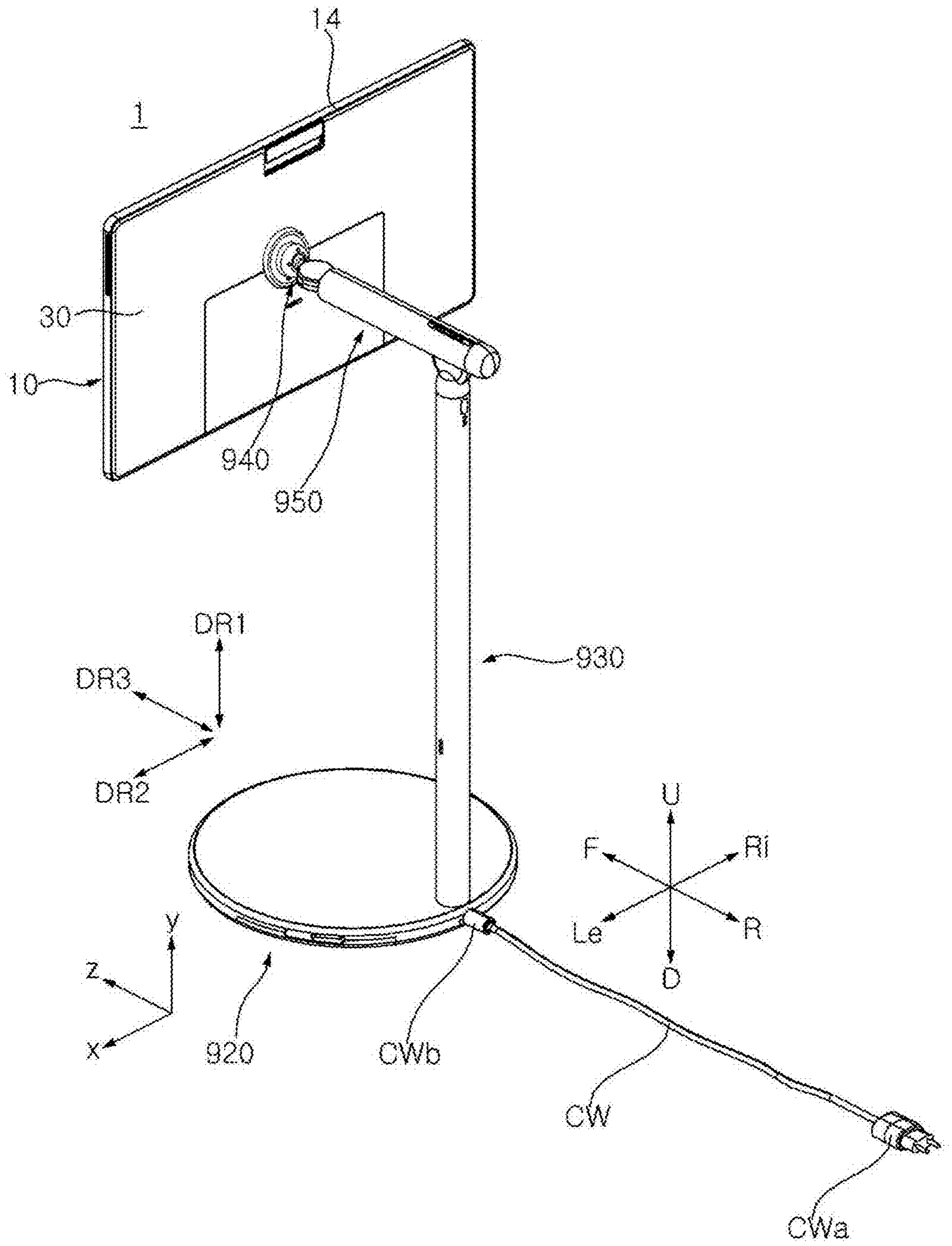

Referring to FIGS. 1 and 2, a display device 1 may include a head 10. The head 10 may display images. The head 10 may be referred to as a display 10 or a display unit 10.

The head 10 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the short sides SS1 and SS2 of the head 10 may be referred to as a first direction DR1 or an up-down direction. A direction parallel to the long sides LS1 and LS2 of the head 10 may be referred to as a second direction DR2 or a left-right direction. A direction perpendicular to the long sides LS1 and LS2 and the short sides SS1 and SS2 of the head 10 may be referred to as a third direction DR3 or a front-rear direction.

A side on which the head 10 displays an image may be referred to as a front side F, z, and a side opposite thereto may be referred to as a rear side R. The first short side SS1 may be referred to as a left side Le, x, and the second short side SS2 may be referred to as a right side Ri. The first long side LS1 may be referred to as an upper side U, y, and the second ling side LS2 may be referred to as a lower side D.

The first long side LS1, the second long side LS2, the first short side SS1, and the second short side SS2 may be referred to as edges of the head 10. A position where the first long side LS1 and the first short side SS1 meet each other may be referred to as a first corner C1. A position where the first short side SS1 and the second long side LS2 meet each other may be referred to as a second corner C2. A position where the second long side LS2 and the second short side SS2 meet each other may be referred to as a third corner C3. A position where the second short side SS2 and the first long side LS1 meet each other may be referred to as a fourth corner C4.

The display device 1 may include a stand 920, 930, 940, and 950 that supports the head 10. The stand 920, 930, 940, and 950 may include a base 920, a pole 930, a rotatable connector 940, and a support arm 950.

The base 920 may be placed on the ground. The base 920 may have a round or angular shape. A plurality of wheels 920W may be provided on a bottom surface of the base 920. A plug CWa of a power cable CW may be connected to a concentric plug that supplies external power, and a jack CWb of the power cable CW may be connected to the base 920. A battery (not shown) may be embedded in the base 920, the pole 930, the support arm 950, and/or the head 10, and may be charged by power supplied through the power cable CW. The display device 1 may receive power from the battery, and thus may operate separately from the power cable CW.

The pole 930 may extend vertically from the base 920. A lower end of the pole 930 may be adjacent to a rim of the base 920 and coupled to the pole 930.

The support arm 950 may extend in a direction intersecting the pole 930 and may be connected to an upper end of the pole 930. The rotatable connector 940 may be disposed between the head 10 and the pole 930 and may be coupled to the head 10 and the pole 930.

Accordingly, the head 10 may be supported by the stand 920, 930, 940, and 950, and may be spaced upward from the ground.

Figure 3:
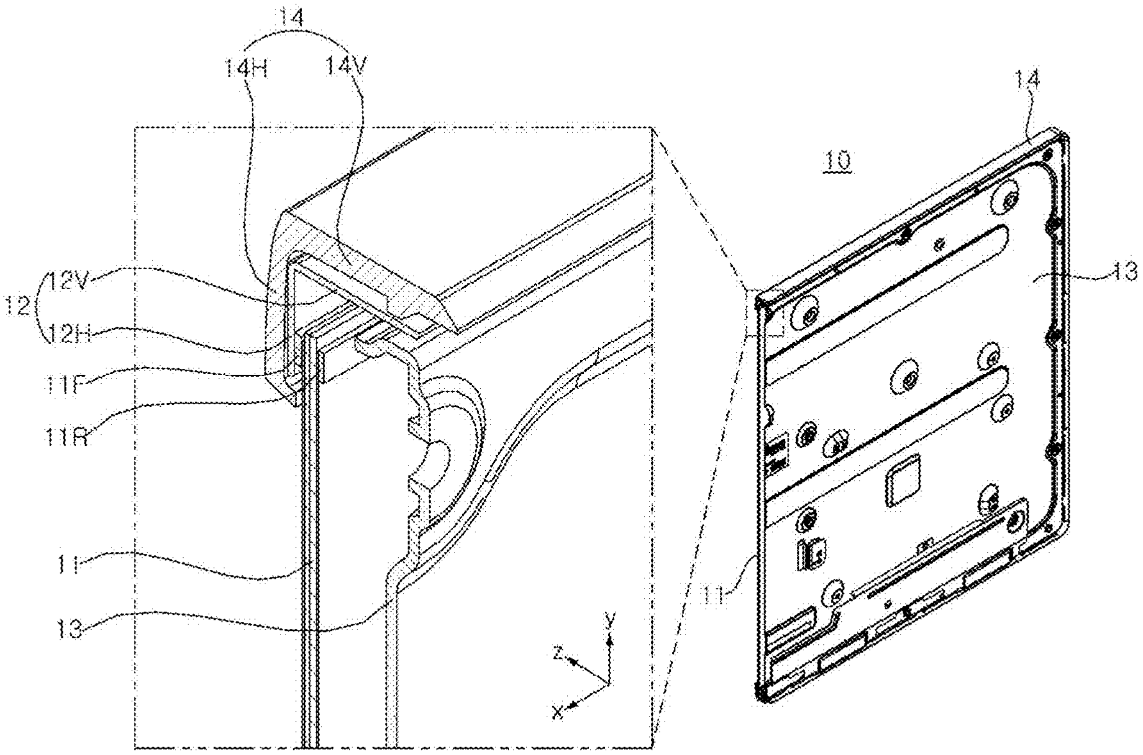
Figure 4:
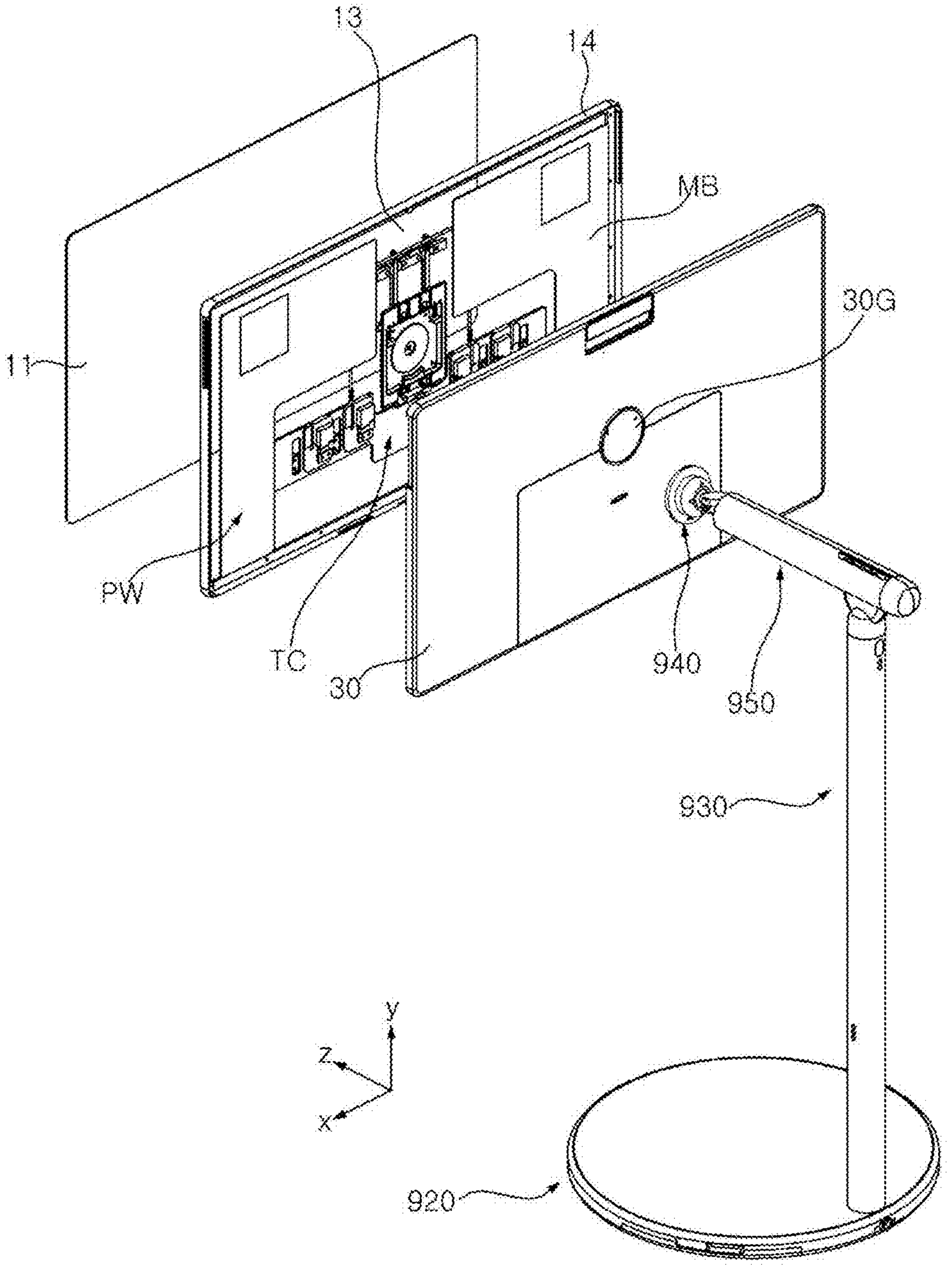

Referring to FIGS. 3 and 4, the head 10 may include a display panel 11, a middle cabinet 12, a frame 13, an end frame 14, and a back cover 30.

The display panel 11 may form a front surface of the head 10. For example, the display panel 11 may be an LCD panel, an OLED panel, or an LED panel. If the display panel 11 is the LCD panel, the head 10 may include a backlight unit for supplying light to the display panel 11. The display panel 11 may divide an image into a plurality of pixels and may output the image while controlling color, brightness, and chroma of the respective pixels. The display panel 11 may be divided into an active area, in which the image is displayed, and a de-active area in which the image is not displayed. The display panel 11 may generate light corresponding to red, green, or blue color in response to a control signal.

The middle cabinet 12 may extend along a perimeter of the display panel 11. A horizontal part 12H may be disposed at the front of the display panel 11. A vertical part 12V may intersect the horizontal part 12H and may cover the side of the display panel 11.

The frame 13 may be disposed at the rear of the display panel 11. Electronic components, such as a Printed Circuit Board (PCB), may be coupled to the frame 13. For example, a power supply board PW, a timing controller board TC, and a main board MB may be mounted on a rear surface of the frame 13.

The end frame 14 may form a perimeter of the head 10. A horizontal part 14H may be disposed at the front of the horizontal part 12H of the middle cabinet 12. A vertical part 14V may cover the side of the vertical part 12V of the middle cabinet 12.

The back cover 30 may form a rear surface of the head 10. The back cover 30 may cover the rear of the frame 13 and may be coupled to the frame 13.

Figure 5:
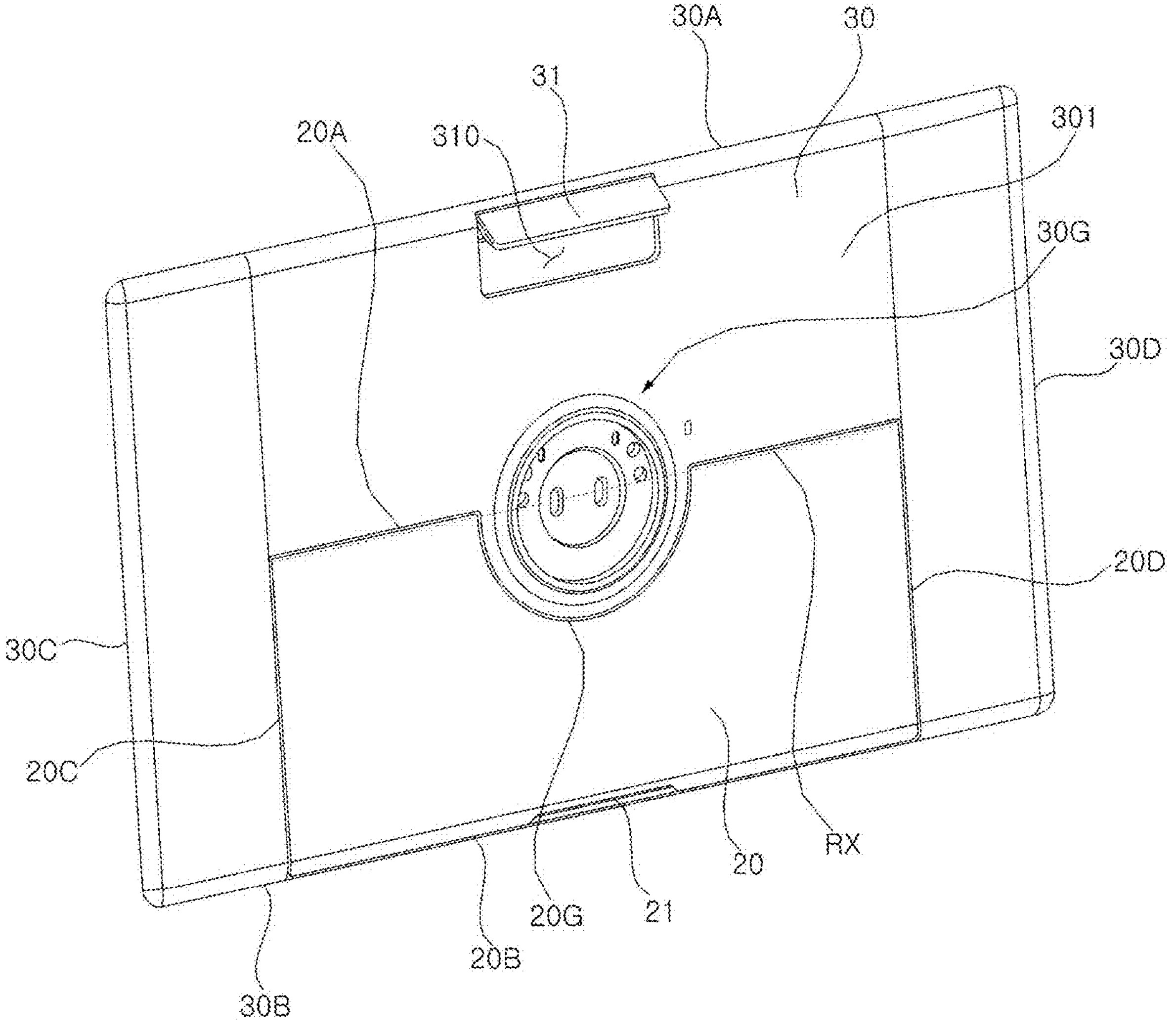

Referring to FIGS. 4 and 5, a mounting part 30G may be formed on a rear surface of the back cover 30. The mounting part 30G may be a portion of the back cover 30. Alternatively, the mounting part 30G may be removably coupled to a portion of the back cover 30.

The rotatable connector 940 may be disposed at the rear of the mounting part 30G. The rotatable connector 940 may be mounted on the mounting part 30G. Accordingly, the rotatable connector 940 may be coupled to the head 10.

Figure 6:
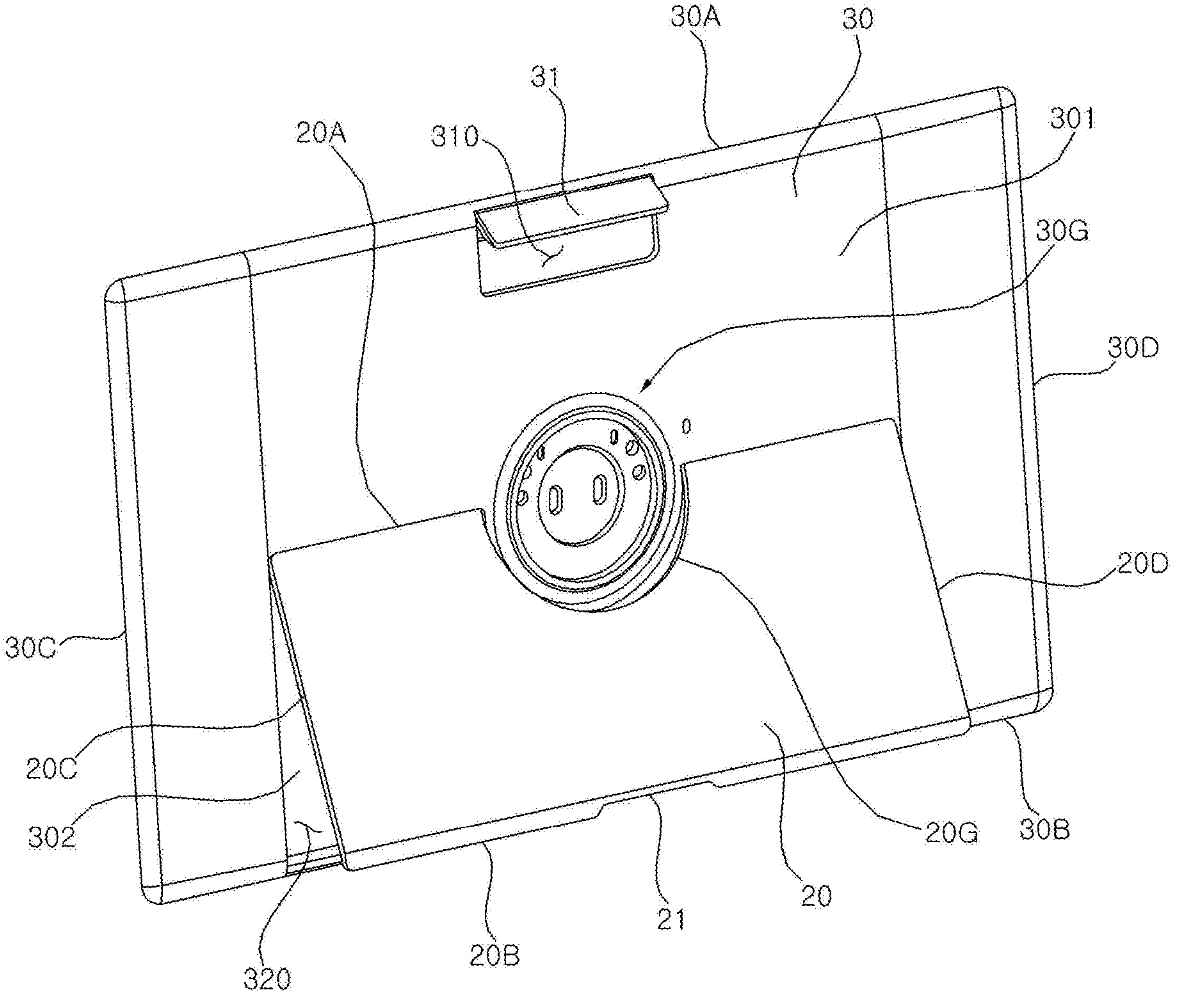

Referring to FIGS. 5 and 6, the display device 1 may include a back cover 30, and a stand cover 20 rotatably coupled to the back cover 30.

The back cover 30 may be disposed at the rear of the display panel 11. The display panel 11 may be coupled to the back cover 30. The back cover 30 may be disposed parallel to the display panel 11. The back cover 30 may cover a rear surface of the display panel 11.

The back cover 30 may include a first long side 30A, a second long side 30B opposite to the first long side 30A, a first short side 30C adjacent to the first long side 30A and the second long side 30B, and a second short side 30D opposite to the first short side 30C. For convenience of explanation, it is illustrated and described that the first and second long sides 30A and 30B are longer than the first and second short sides 30C and 30D, but it is also possible that the lengths of the first and second long sides 30A and 30B are approximately equal to the lengths of the first and second short sides 30C and 30D.

The first long side 30A, the second long side 30B, the first short side 30C, and the second short side 30D of the back cover 30 may be referred to as edges of the back cover 30.

The stand cover 20 may be rotatably coupled to the back cover 30. A shape of the stand cover 20 may correspond to a shape of the back cover 30. A size of the stand cover 20 may be smaller than a size of the back cover 30. One side of the stand cover 20 may be rotatably coupled to the back cover 30. For example, the stand cover 20 may have a rectangular shape with a size smaller than the back cover 30 having a rectangular shape, and one side of the stand cover 20 may be rotatably coupled to a rear surface of the back cover 30.

The stand cover 20 may include a first long side 20A, a second long side 20B opposite to the first long side 20A, a first short side 20C adjacent to the first long side 20A and the second long side 20B, and a second short side 20D opposite to the first short side 20C. For convenience of explanation, it is illustrated and described that the first and second long sides 20A and 20B are longer than the first and second short sides 20C and 20D, but it is also possible that the lengths of the first and second long sides 20A and 20B are approximately equal to the lengths of the first and second short sides 20C and 20D.

The first long side 20A, the second long side 20B, the first short side 20C, and the second short side 20D of the stand cover 20 may be referred to as edges of the stand cover 20.

The first long side 20A of the stand cover 20 may be parallel to the first long side 30A of the back cover 30. The second long side 20B of the stand cover 20 may be parallel to the second long side 30B of the back cover 30. The first short side 20C of the stand cover 20 may be parallel to the first short side 30C of the back cover 30. The second short side 20D of the stand cover 20 may be parallel to the second short side 30D of the back cover 30.

A rotation axis RX of the stand cover 20 may be disposed parallel to one side of the back cover 30. For example, the rotation axis RX of the stand cover 20 may be disposed parallel to the first and/or second long sides 30A and 30B of the back cover 30. The rotation axis RX of the stand cover 20 may be adjacent to the first long side 20A of the stand cover 20. The rotation axis RX of the stand cover 20 may be coupled to the center of the back cover 30.

There may be a plurality of shafts 23 (see FIG. 8) of the stand cover 20. The shaft 23 may refer to a physical component that rotates about the rotation axis RX. The shaft 23 may be connected to the stand cover 20. The shaft 23 may integrally rotate with the stand cover 20.

The stand cover 20 may include a semicircular bent portion 20G formed on the first long side 20A and corresponding to the mounting part 30G of the back cover 30.

The stand cover 20 may partially cover the back cover 30. A surface of the back cover 30 may face rearward. The surface of the back cover 30 may form the exterior. The back cover 30 may include a first surface portion 301 that is exposed to the outside, and a second surface portion 302 covered by the stand cover 20. The first surface portion 301 may not be covered by the stand cover 20. The second surface portion 302 may correspond to the stand cover 20. For example, a shape of the second surface portion 302 may correspond to a shape of the stand cover 20. An area of the second surface portion 302 may correspond to an area of the stand cover 20. A position of the second surface portion 302 may correspond to a position of the stand cover 20.

When the stand cover 20 is in a folded state, the stand cover 20 may be in contact with the second surface portion 302. The folded state of the stand cover 20 may refer to a state in which the stand cover 20 does not function as a stand. Alternatively, the folded state of the stand cover 20 may refer to a state in which the stand cover 20 is disposed parallel to the back cover 30, or a state in which a rear surface of the stand cover 20 is in contact with the second surface portion 302. The rear surface of the stand cover 20 may refer to a surface opposite to the surface of the stand cover 20.

When the stand cover 20 is in a folded state, the second long side 20B of the stand cover 20 may be placed on the second long side 30B of the back cover 30. The first long side 20A of the stand cover 20 may be disposed between the first and second long sides 30A and 30B of the back cover 30. The first and second short sides 20C and 20D of the stand cover 20 may be inwardly spaced apart from the first and second short sides 30C and 30D, respectively, of the back cover 30.

By contrast, an unfolded state of the stand cover 20 may refer to a state in which the stand cover 20 functions as a stand. Alternatively, the unfolded state of the stand cover 20 may refer to a state in which the stand cover 20 is inclined with respect to the back cover 30. That is, the unfolded state of the stand cover 20 may refer to a state in which the stand cover 20 forms an angle with respect to the back cover 30. Alternatively, the unfolded state of the stand cover 20 may refer to a state in which the rear surface of the stand cover 20 is spaced apart from the second surface portion 302.

In the unfolded state of the stand cover 20, the second long side 20B of the stand cover 20 may be spaced apart from the second long side 30C of the back cover 30.

The second surface portion 302 may be recessed from the first surface portion 301. The stand cover 20 may be accommodated in a recessed space of the second surface portion 302. For example, the back cover 30 may include a stand receiving portion 320 formed by recessing the second surface portion 302 from the first surface portion 301. The stand cover 20 may be disposed in the stand receiving portion 320. For example, the stand cover 20 which is folded may be disposed in the stand receiving portion 320, and the stand cover 20 which is unfolded may be withdrawn from the stand receiving portion 320.

A depth of the stand receiving portion 320 may correspond to a thickness of the stand cover 20. The stand cover 20 received in the stand receiving portion 320 may be disposed parallel to the first surface portion 301. For example, the stand cover 20 received in the stand receiving portion 320 may form a plane parallel to the first surface portion 301.

The stand cover 20 may include a stand groove 21 formed by cutting a portion of the edge. A user may insert his or her hand into the stand groove 21 to remove the stand cover 20. In this manner, the user may unfold the stand cover 20 which is in contact with the back cover 30. The stand groove 21 may be formed in the long side of the stand cover 20. For example, the stand groove 21 may be recessed in the second long side 20B of the stand cover 20. The second long side 30B of the back cover 30 may be exposed to the outside through the stand groove 21.

The display device 1 may include a handle 31 rotatably coupled to the back cover 30. A rotation axis of the handle 31 may be disposed parallel to the first long side 30A of the back cover 30. A rotation axis of the handle 31 may be disposed adjacent to the first long side 30A of the back cover 30. The handle 31 may rotate in a direction corresponding to the rotation direction of the stand cover 20.

The back cover 30 may include a handle receiving portion 310 recessed from the first surface portion 301. The handle 31 may be received in the handle receiving portion 310. When folded, the handle 31 may be disposed in the handle receiving portion 310. When unfolded, the handle 31 may be withdrawn from the handle receiving portion 310.

The handle 31 may rotate within a limited angle range. The handle 31 may be pivoted. For example, when a first side of the handle 31 contacts the back cover 30, rotation of the handle 31 may be stopped. In this case, the handle 31 may be unfolded at a maximum angle. A user may carry the display device 1 while holding the handle 31 which is unfolded. A second side of the handle 31, which is opposite to the first side thereof, may be spaced apart from a periphery of the handle receiving portion 310. A user may insert his or her hand into a separation space formed between the second side of the handle 31 and the periphery of the handle receiving portion 310.

Figure 7:
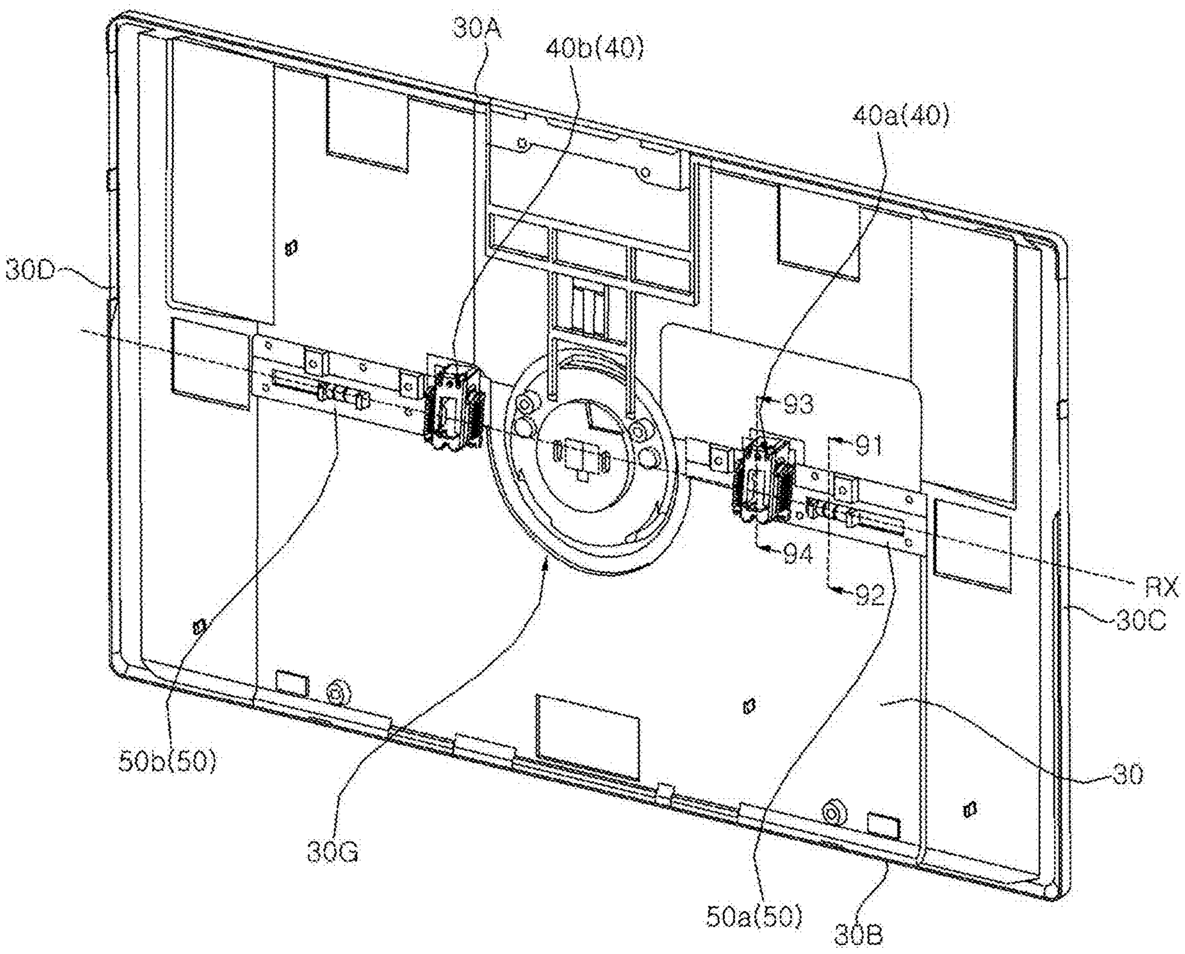

Referring to FIG. 7, the display device 1 may include a bracket 50 coupled to the back cover 30 and a pivot control device 40 coupled to the back cover 30.

The bracket 50 may be coupled to a rear surface of the back cover 30. The bracket 40 may be elongated toward the rotation axis RX of the stand cover 20. A position of the bracket 50 may correspond to a position of the rotation axis RX of the stand cover 20. The bracket 50 may cover the shaft 23 (see FIG. 8) located on the rotation axis RX of the stand cover 20. The shaft 23 rotating the stand cover 20 may be coupled to the bracket 50.

There may be a plurality of brackets 50. The plurality of brackets 50 may be spaced apart from each other in the left-right direction with respect to the mounting part 30G. For example, the bracket 50 may include a first bracket 50*a* extending from the mounting part 30G toward the first short side 30C of the back cover 30, and a second bracket 50*b* extending from the mounting part 30G toward the second short side 30D of the back cover 30.

The pivot control device 40 may control rotation of the stand cover 20. The pivot control device 40 may be operated by a driving force applied by a user to the stand cover 20. The pivot control device 40 may or may not be operated depending on a magnitude of the driving force that rotates the stand cover 20.

For example, if a user rotates the folded stand cover 20 in a forward direction with a driving force less than or equal to a threshold driving force, the pivot control device 40 may control the stand cover 20 not to rotate in the forward direction. By contrast, if a user rotates the folded stand cover 20 in the forward direction with a driving force greater than or equal to the threshold driving force, the pivot control device 40 may control the stand cover 20 to rotate in the forward direction. That is, the stand cover 20 may be unfolded.

In addition, if a user rotates the unfolded stand cover 20 in a reverse direction with a driving force less than or equal to the threshold driving force, the pivot control device 40 may control the stand cover 20 not to rotate in the reverse direction. By contrast, if a user rotates the unfolded stand cover 20 in the reverse direction with a driving force greater than or equal to the threshold driving force, the pivot control device 40 may control the stand cover 20 to rotate in the reverse direction. That is, the stand cover 20 may be folded.

In the following description, the rotation may include a forward rotation and a reverse rotation, and a rotation direction may include a forward direction and a reverse direction. The forward rotation direction may refer to a direction in which the folded stand cover 20 rotates in an unfolding direction. The reverse rotation direction may refer to a direction in which the unfolded stand cover 20 rotates in a folding direction.

Figure 8:
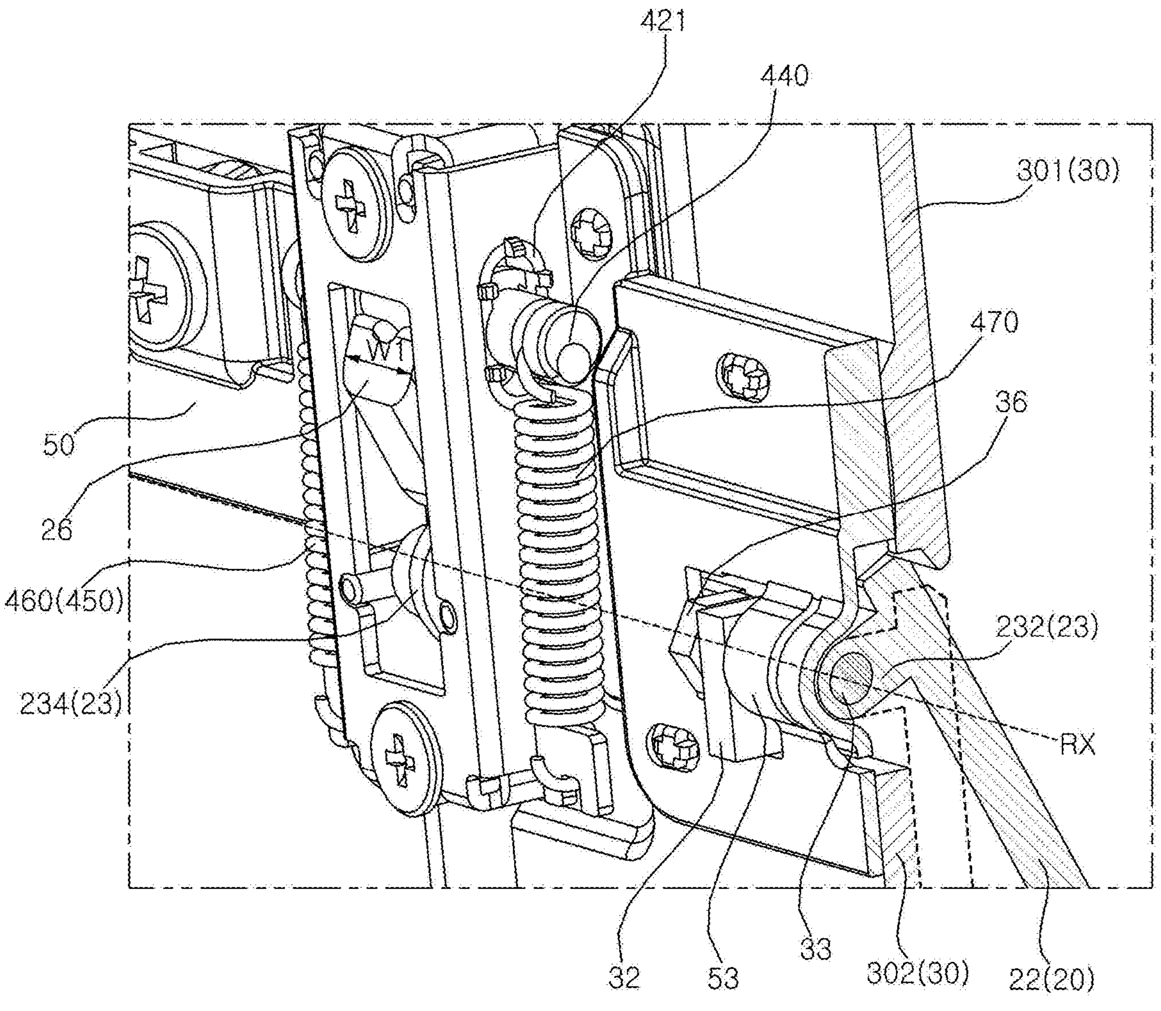

FIG. 8 is a cut-away sectional view taken along line 91-92 of FIG. 3.

Referring to FIG. 8, the display device 1 may include a sub pin 33 that rotatably connects the back cover 30 and the stand cover 20.

The sub pin 33 may be elongated toward the rotation axis RX. The sub pin 33 may be located on the rotation axis RX of the stand cover 20. The sub pin 33 may be coupled to the stand cover 20. The sub pin 33 may be coupled to the shaft 23. The shaft 23 may rotate about the sub pin 33. The rotation axis RX may pass through the center of the sub pin 33.

The stand cover 20 may include a sub shaft 232 to which the sub pin 33 is coupled. The sub shaft 232 may protrude from the rear surface of the stand cover 20. The sub shaft 232 may include a space in which the sub pin 33 is received. The sub pin 33 may pass through the sub shaft 232, and both ends of the sub pin 33 may be fixed to the back cover 30.

The back cover 30 may include a slit 37 (see FIG. 10) which is a space in which the sub shaft 232 is disposed. The slit 37 (see FIG. 10) may be elongated in a direction of the rotation axis RX of the stand cover 20. The sub pin 33 may be located in the slit 37 (see FIG. 10). The slit 37 (see FIG. 10) may be a separation space between the first surface portion 301 and the second surface portion 302. For example, the back cover 30 may include the slit 37 (see FIG. 10) disposed between the first surface portion 301 and the second surface portion 302 and elongated in the direction of the rotation axis RX, and the sub pin 33 may be disposed in the slit 37 (see FIG. 10).

The back cover 30 may include a pin coupling part 32 to which the sub pin 33 is coupled. The pin coupling part 32 may include a hole in which the sub pin 33 is disposed. The pin coupling part 32 may be formed on a rear surface of the back cover 30. The pin coupling part 32 may protrude forward from the rear surface of the back cover 30. The pin coupling part 32 may be a pair of pin coupling parts 32 disposed at both ends of the sub shaft 232 in the longitudinal direction. That is, the sub shaft 232 of the stand cover 20 may be disposed between the pair of pin coupling parts 32. The sub pin 33 may allow the pair of pin coupling parts 32 to be coupled to the sub shaft 232 of the stand cover 20. The pair of pin coupling parts 32 may pass through the bracket 50 to protrude forward.

The display device 1 may include a nut 36 for fixing the sub pin 33. The nut 36 may fix the sub pin 33 to the pin coupling part 32. The sub pin 33 may pass through the pin coupling part 32 and may protrude from the pin coupling part 32. The nut 36 may be fastened to an end of the sub pin 33 protruding from the pin coupling part 32.

The bracket 50 may include a shaft cover 53 covering the sub shaft 232 of the stand cover 20. The shaft cover 53 may partially cover the sub shaft 232 of the stand cover 20. The shaft cover 53 may be disposed between the pair of pin coupling parts 32.

Figure 9:
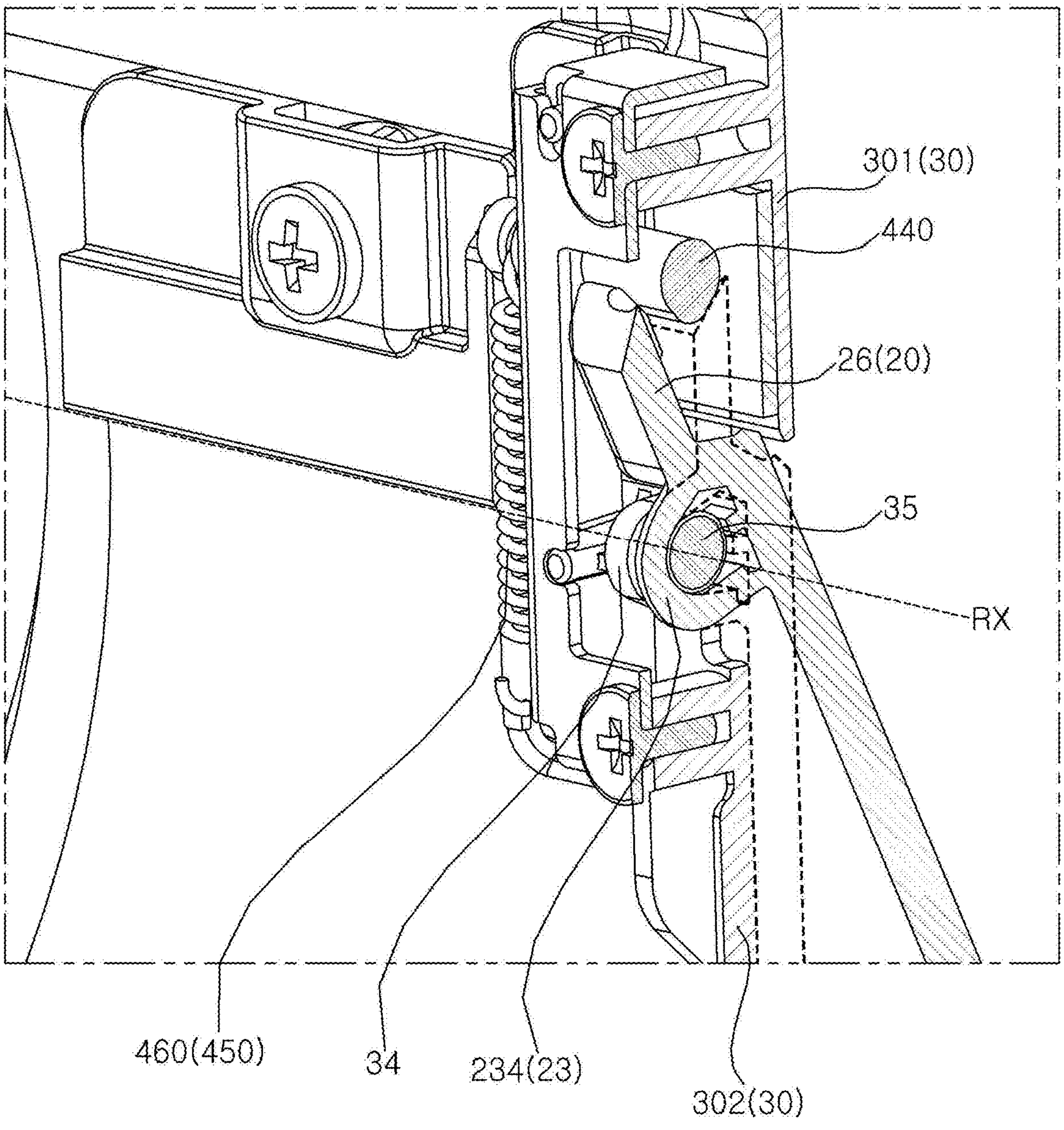

FIG. 9 is a cut-away sectional view taken along line 93-94 of FIG. 3.

Referring to FIG. 9, the shaft 23 may include a cam shaft connected to a cam 26, and the back cover 30 may include a shaft coupling part 34 to which the cam shaft 234 is coupled, a follower shaft 440 corresponding to the cam 26, and an elastic member 45 connected to the follower shaft 440.

The stand cover 20 may include the cam 26 integrally rotating with the stand cover 20. The cam 26 may integrally rotate with the cam shaft 234. The cam 26 may rotate about the rotation axis RX. The cam 26 may extend from the cam shaft 234. The cam 26 may extend in a direction intersecting the rotation axis RX. The stand cover 20 may include a cover part 22 extending from the cam shaft 234 in a first direction, and the cam 26 extending from the cam shaft 234 in a second direction. The second direction may be a direction opposite to the first direction.

The shaft coupling part 34 may be formed on the rear surface of the back cover 30. The shaft coupling part 34 may protrude forward from the back cover 30. The back cover 30 may include a cam pin 35 extending from the shaft coupling part 34 in an axial direction of the rotation axis RX. The cam shaft 234 may be coupled to the cam pin 35. The cam pin 35 may be located on the rotation axis RX. The cam pin 35 may be spaced apart from the sub pin 33 in the axial direction of the rotation axis RX.

The follower shaft 440 may convert a rotational motion of the cam 26 into a linear motion. The follower shaft 440 may slide by the rotation of the cam 26. The follower shaft 440 may slide in one direction or a direction opposite to the one direction. The follower shaft 440 may reciprocate in a direction closer to or away from the rotation axis RX. For example, the follower shaft 440 may reciprocate in an up-down direction. The follower shaft 440 may contact the cam 26.

The follower shaft 440 may extend in the axial direction of the rotation axis RX. The follower shaft 440 may be spaced apart from the rotation axis RX. For example, the follower shaft 440 may be formed in a bar shape extending in the axial direction of the rotation axis RX, and may be spaced apart from the rotation axis RX in a direction intersecting the rotation axis RX.

The elastic member 450 may be coupled to the follower shaft 440. The elastic member 450 may be fixed to an end of the follower shaft 440. The elastic member 450 may be fixed to the back cover 30. For example, the elastic member 450 may be a spring 450 having a first end fixed to the end of the follower shaft 440 and a second end fixed to the back cover 30.

The elastic member 450 may apply an elastic force to return the follower shaft 440 to an original position. When the follower shaft 440 deviates from the original position, the elastic member 450 may apply an elastic force so that the follower shaft 440 may move to the original position. For example, when the follower shaft 440 is moved by the cam 26 in a direction away from the rotation axis RX, the elastic member 450 may apply an elastic force, which acts in a direction from the follower shaft 440 toward the rotation axis RX, to the follower shaft 440.

The follower shaft 440 may remain in contact with the cam 26 by the elastic force of the elastic member 450.

The cam 26 may rotate as the stand cover 20 is folded and unfolded. When the user unfolds the stand cover 20, the cover part 22 and the cam 26 may rotate in the forward direction. When the user folds the stand cover 20, the cover part 22 and the cam 26 may rotate in the reverse direction. When the cam 26 rotates in the forward or reverse direction, the follower shaft 440 may move upward or downward.

Figure 10:
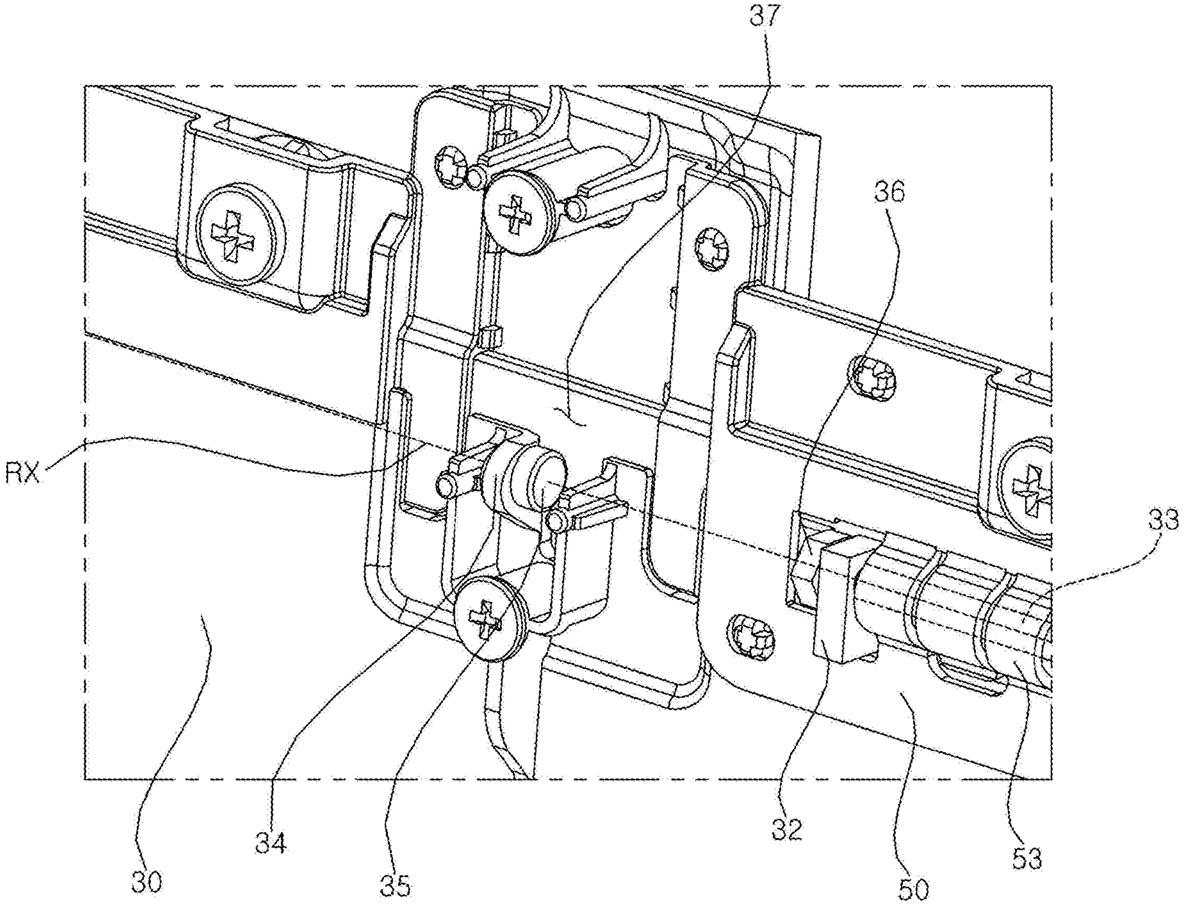

Referring to FIG. 10, the cam pin 35 may be spaced apart from the sub pin 33.

The stand cover 20 may rotate about the cam pin 35 or the sub pin 33. The cam pin 35 and the sub pin 33 may extend in the axial direction of the rotation axis RX. The cam pin 35 may be a physical component serving as the center of rotation of the cam 26. The sub pin 33 may be a physical component serving as the center of rotation of the stand cover 20. The rotation axis RX of the stand cover 20 may pass through the cam pin 35 and the sub pin 33. That is, the sub pin 33 and the cam pin 35 may be located on the rotation axis RX of the stand cover 20. In this manner, the stand cover 20 may rotate about a single rotation axis RX. The sub shaft 232 and the cam shaft 234 may integrally rotate with each other about the single rotation axis RX. The cam pin 35 may be spaced apart from the sub pin 33 in the axial direction of the rotation axis RX.

Figure 11:
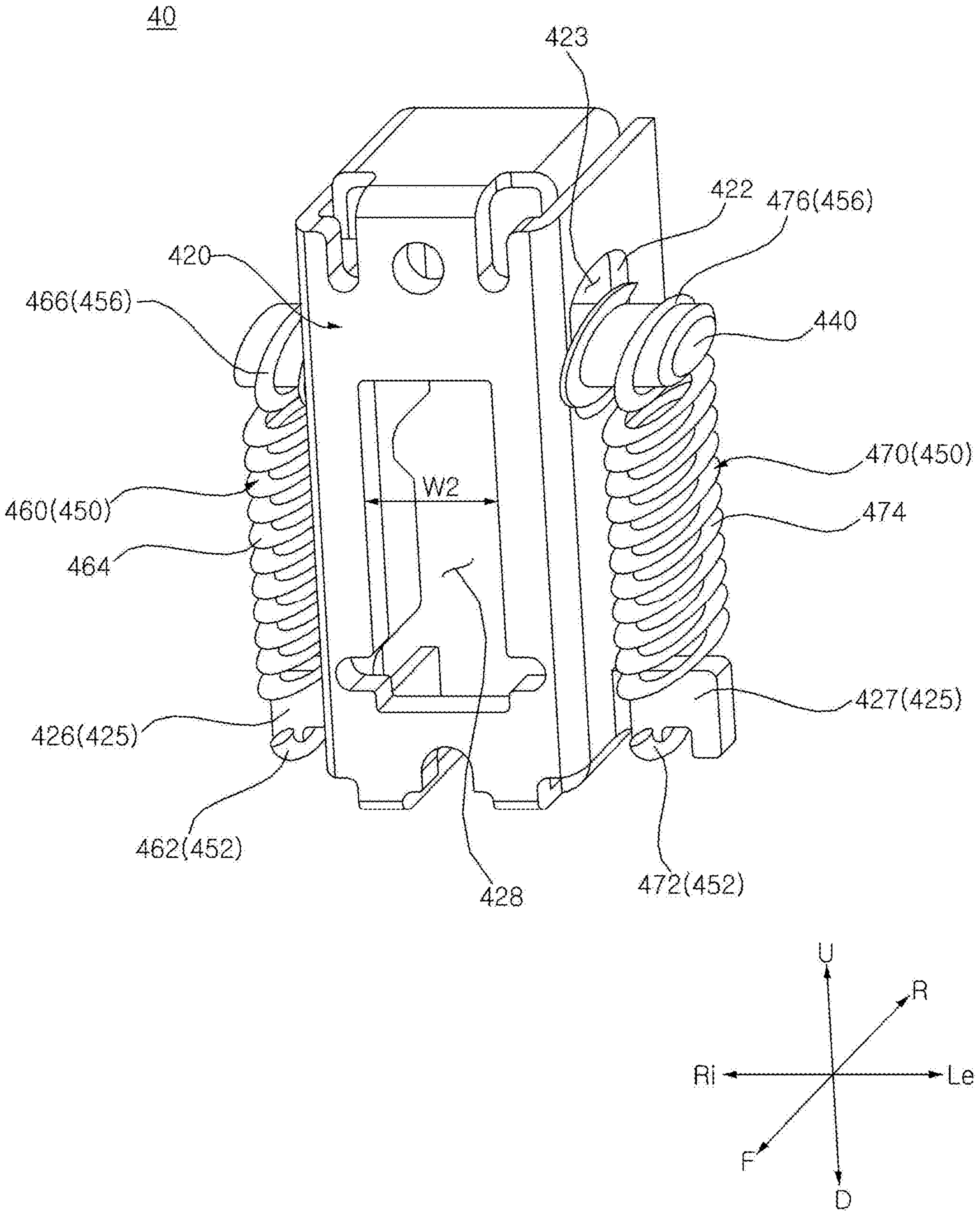

Referring to FIG. 11, the pivot control device 40 may include a case 420 in which the follower shaft 440 and the elastic member 450 are mounted.

The case 420 may be coupled to the rear surface of the back cover 30. The case 420 may accommodate the shaft coupling part 34 to which the cam 26 is coupled. The shaft coupling part 34 may be disposed in the case 420. The cam 26 and/or the cam shaft 234 may be disposed in the case 420. The cam 26 and/or the cam shaft 234 may rotate inside the case 420.

The follower shaft 440 may be movably coupled to the case 420. The case 420 may include a slide rail 422 on which the follower shaft 440 is movably mounted. The slide rail 422 may be a periphery of a slide hole 423 formed in the case 420. The follower shaft 440 may be disposed in the slide hole 423. The slide rail 422 may extend in a moving direction of the follower shaft 440. The slide rail 422 may guide movement of the follower shaft 440. For example, the follower shaft 440 may reciprocate upward and downward along the slide rail 422 extending in an up-down direction.

The slide rail 422 may be formed on one surface and another surface of the case 420. For example, the slide rail 422 may be a pair of slide rails 422 formed on each of a left surface and a right surface of the case. The follower shaft 440 may be mounted on the pair of slide rails 422. The follower shaft 440 may pass through the case 420 through the slide rail 422. Both ends of the follower shaft 440 in a longitudinal direction may protrude outward from the case 420.

Referring to FIG. 8, the case 420 may include a rail gasket 421 coupled to the slide rail 422. The rail gasket 421 may cover the slide rail 422. A shape of the rail gasket 421 may correspond to a shape of the slide rail 422. The rail gasket 421 may include a pair of rail gaskets 421 coupled to the pair of slide rails 422.

The rail gasket 421 may separate the follower shaft 440 and the slide rail 422. The follower shaft 440 may contact the rail gasket 421. The follower shaft 440 may reciprocate along the rail gasket 421. The follower shaft 440 may be made of a metal material. The rail gasket 421 may be made of a polymer material. The case 420 may be made of a metal material. The rail gasket 421 may minimize friction noise and/or friction vibration caused by contact between the case 420 made of a metal material and the follower shaft 440 made of a metal material.

Referring to FIG. 11, the case 420 may include an opening 428 formed in a direction intersecting the rotation axis RX of the stand cover 20. The opening 428 may open from the back cover 30 toward the cam 26. For example, the case 420 may include the opening 428 that opens forward from an inner space of the case 420. The cam 26 that rotates may protrude to a front side of the case through the opening 428. A width of the opening 428 that extends towards the rotation axis RX may be greater than a width of the cam 26 that extends towards the rotation axis RX. For example, a width W2 of the opening 428 that extends in the left-right direction may be greater than a width W1 of the cam 26 that extends in the left-right direction.

The elastic member 450 may be fixed to the case 420. A first end of the elastic member 450 may be fixed to the follower shaft 440, and a second end of the elastic member 450 may be fixed to the case 420.

The elastic member 450 may include a pair of elastic members 450 which are respectively fixed to both ends of the follower shaft 440 in the longitudinal direction. For example, the elastic member 450 may be a pair of springs 450 fixed to both ends of the follower shaft 440 in a left-right direction.

The elastic member 450 may include a loop 456 fixed to an end of the follower shaft 440. A shape of the loop 456 may correspond to a shape of the circumference of the follower shaft 440. For example, the follower shaft 440 may be in the shape of an elongated round bar, and the elastic member 450 may have an annular shape. An end of the follower shaft 440 may be fixed by being inserted into the loop 456 of the elastic member 450. For example, the elastic member 450 may include a first elastic member 460 having a first loop 466 fixed to a right end of the follower shaft 440, and a second elastic member 470 having a second loop 476 fixed to a left end of the follower shaft 440.

The case 420 may include a fixing part 425 to which the second end of the elastic member 450 is fixed. The fixing part 425 may protrude from the case 420 toward the rotation axis RX. For example, the case 420 may include a first fixing part 426 protruding rightward and a second fixing part 427 protruding leftward.

The elastic member 450 may include a hook 452 formed at the second end thereof. The hook 452 may have an annular shape. The hook 452 may be hooked to the fixing part 425 of the case 420. For example, a first hook 462, which is hooked to the first fixing part 426, may be formed at a lower end of the first clastic member 460, and a second hook 472, which is hooked to the second fixing part 427, may be formed at a lower end of the second elastic member 470.

Figure 12:
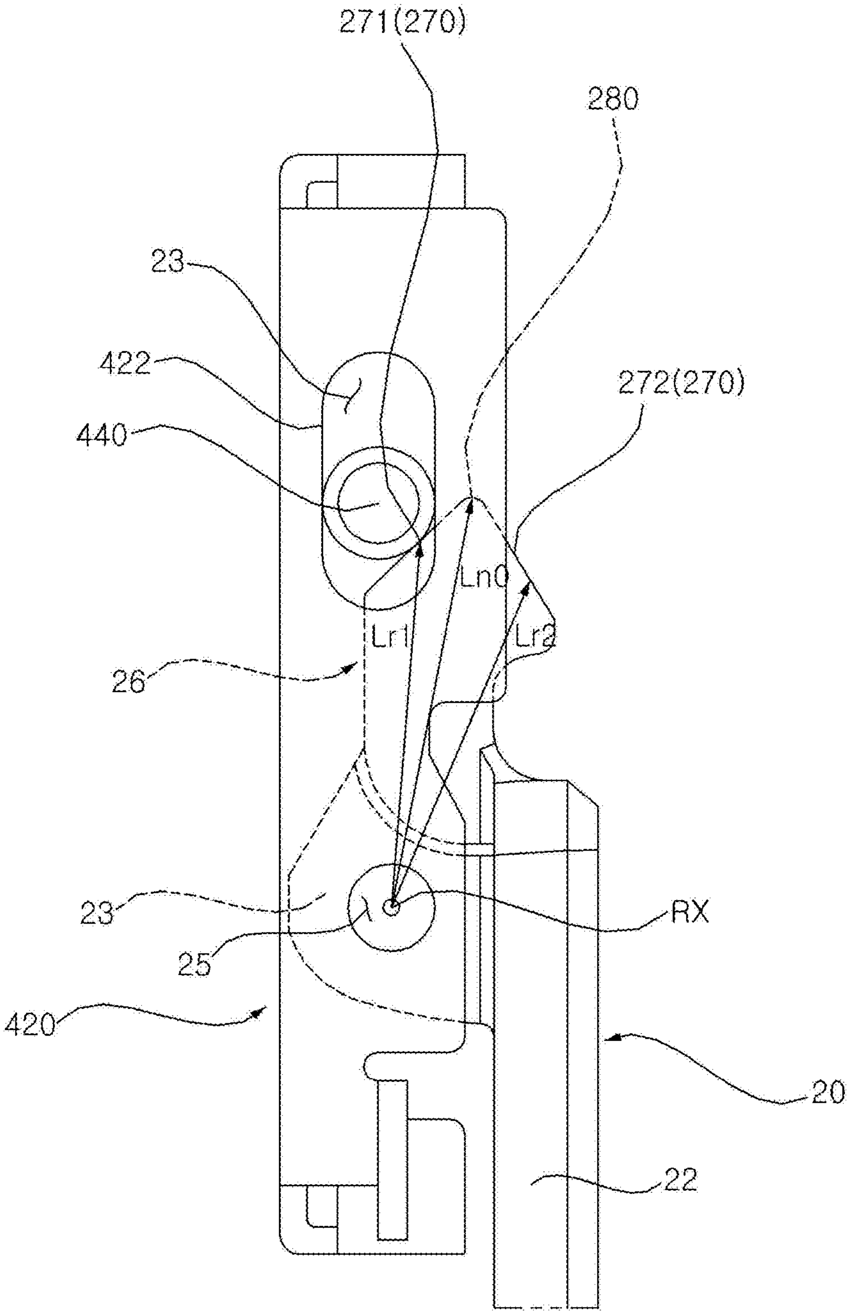

Referring to FIG. 12, the cam 26 may include a ramp 270 and a nose 280.

The cam shaft 234 may include a cam shaft receiving portion 25 in which the cam pin 35 is disposed. The cam shaft receiving portion 25 may be a space that extends toward the rotation axis RX of the stand cover 20.

The cam 26 may extend from the cam shaft 234 in a direction intersecting the rotation axis RX. The cam 26 may transmit a driving force to the follower shaft 440. The cam 26 may rotate about the rotation axis RX. The cam 26 may contact the follower shaft 440.

The cam 26 may include the ramp 270 contacting the follower shaft 440. The ramp 270 may be an area, range, or section of contact with the follower shaft 440. That is, as the cam 26 rotates, the follower shaft 440 may move along the ramp 270. The elastic member 450 may apply lateral pressure between the ramp 270 and the follower shaft 440, thereby allowing the ramp 270 and the follower shaft 440 to remain in contact with each other. The ramp 270 may be one surface of the cam 26. The ramp 270 may have a planar or curved shape. For example, the ramp 270 may extend flatly.

The ramp 270 may be a portion of a peripheral surface of the cam 26. The ramp 270 may be spaced apart from the rotation axis RX or the cam shaft 234. A distance by which the ramp 270 is spaced apart from the rotation axis RX or the cam shaft 234 may vary depending on each position of the ramp 270. For example, the ramp 270 may include a first ramp 271 spaced apart from the rotation axis RX or the camp shaft 234 by a distance that increases as the cam 26 rotates in the forward direction. For example, the ramp 270 may include a second ramp 272 spaced apart from the rotation axis RX or the camp shaft 234 by a distance that decreases as the cam 26 rotates in the forward direction.

The first ramp 271 may be inclined so as to move away from the nose 280 and closer to the rotation axis RX. The second ramp 272 may be inclined so as to move away from the nose 280 and closer to the rotation axis RX. For example, the first ramp 271 may extend from the nose 280 toward one end of the ramp and may be inclined so as to move closer to the rotation axis RX. For example, the second ramp 272 may extend from the nose 280 toward another end of the ramp and may be inclined so as to move closer to the rotation axis RX.

The ramp 270 may include the nose 280. The nose 280 may be disposed between both distal ends of the ramp 270. The nose 280 may be disposed between the first ramp 271 and the second ramp 272. The nose 280 may connect the first ramp 271 and the second ramp 272. For example, the nose 280 may connect the first ramp 271 and the second ramp 272 in a curved manner.

The nose 280 may be a portion of the ramp 270 that is furthest away from the rotation axis RX or the cam shaft 234. For example, a distance Ln0 by which the nose 280 is spaced apart from the rotation axis RX may be greater than a distance Lr1 or Lr2 by which the first ramp 271 or the second ramp 272 is spaced apart from the rotation axis RX.

The nose 280 may be a portion of the ramp 270 at which a distance from the rotation axis RX or the cam shaft 234 increases and then decreases in a rotation direction of the rotation axis RX.

The follower shaft 440 may move while maintaining contact with the ramp 270. For example, the follower shaft 440 may move upward or downward while maintaining contact with the ramp 270. For example, when the cam 26 rotates in the forward direction, the follower shaft 440 may move upward while being in contact with the first ramp 271 and may move downward while being in contact with the second ramp 272. By contrast, when the cam 26 rotates in the reverse direction, the follower shaft 440 may move upward while being in contact with the second ramp 272 and may move upward while being in contact with the first ramp 271.

Figure 13:
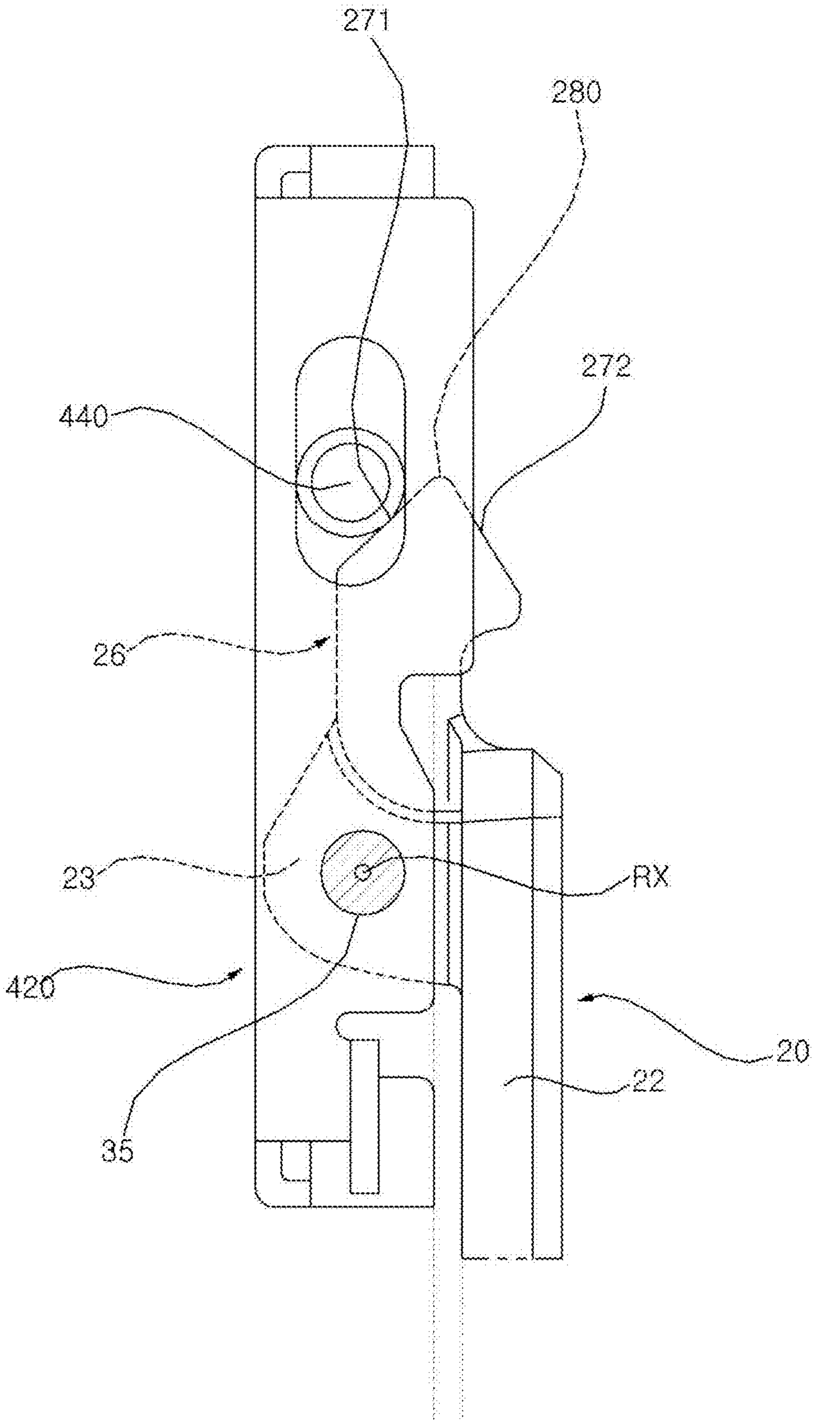

FIG. 13 is a diagram illustrating the follower shaft 440 when coming into contact with the first ramp 271.

Figure 14:
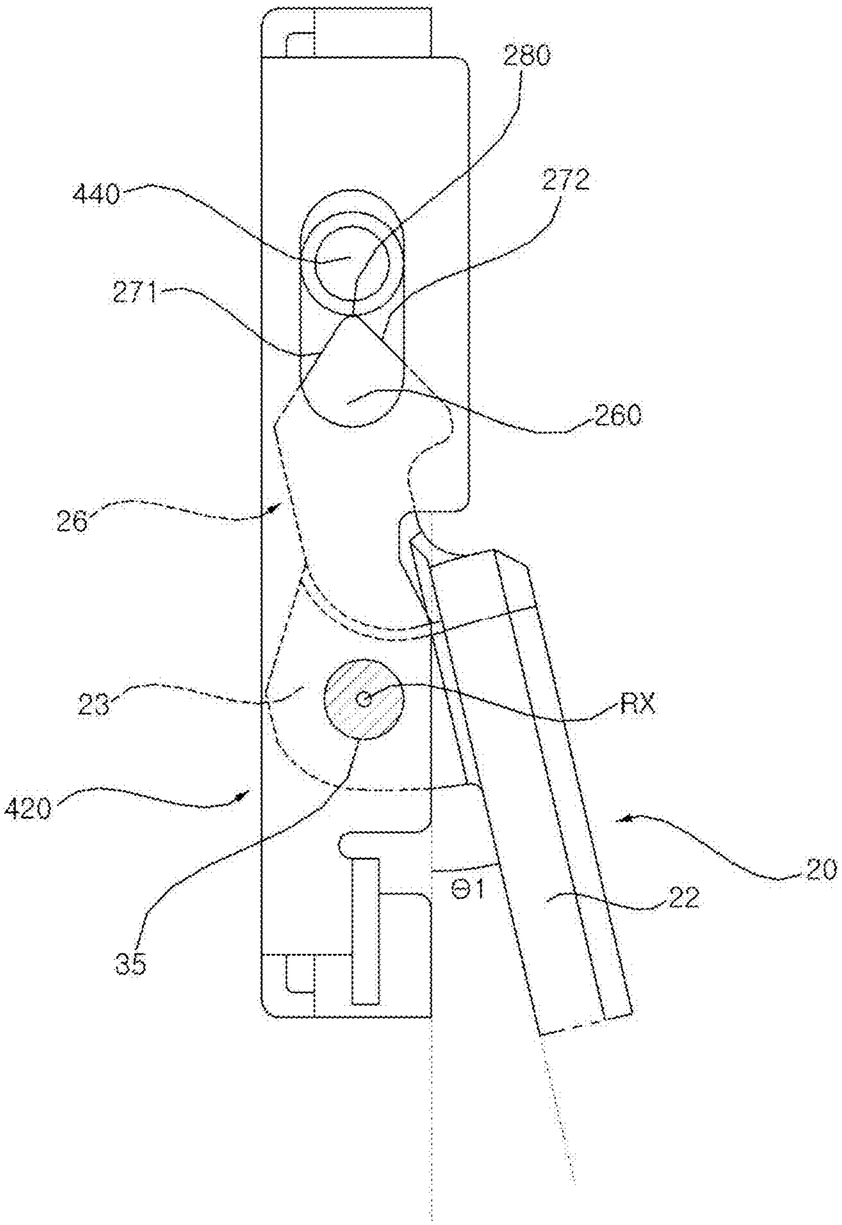

FIG. 14 is a diagram illustrating the follower shaft 440 when coming into contact with the nose 280.

Referring to FIGS. 13 and 14, a mechanism of manually unfolding the stand cover 20 will be described below.

When a user gradually rotates the stand cover 20 in the forward direction, the follower shaft 440 which is in contact with the first ramp 271 as illustrated in FIG. 13 may contact the nose 280 as illustrated in FIG. 14. That is, when the user applies a torque to the stand cover 20 to rotate the stand cover 20 in the forward direction, the follower shaft 440 which is in contact with the ramp 271 may gradually move in a direction closer to the nose 280 along the first ramp 271. In this process, the follower shaft 440 may move upward along the slide rail 422. That is, a distance between the follower shaft 440 and the rotation axis RX in FIG. 13 may increase as the follower shaft 440 moves in the direction closer to the nose 280 along the first ramp 271.

When the follower shaft 440 is positioned at the nose 280, the follower shaft 440 and the rotation axis RX may be spaced apart from each other by a maximum distance. In addition, when the follower shaft 440 is positioned at the nose 280, the follower shaft 440 may be located at a highest portion of the slide rail 422.

When the follower shaft 440 moves along the first ramp 271 as the stand cover 20 rotates in the forward direction, an angle at which the stand cover 20 is inclined with respect to the back cover 30 may gradually increase from zero degrees. For example, when the follower shaft 440 is positioned at the nose 280, the stand cover 20 may form a first angle θ1 with respect to the back cover 30. A region in which the follower shaft 440 moves along the first ramp 217 may correspond to an angle ranging from zero degrees to the first angle θ1 at which the stand cover 20 is inclined with respect to the back cover 30.

As the distance between the follower shaft 440 and the rotation axis RX increases, an elastic force applied by the clastic member 450 to the follower shaft 440 in a direction toward the rotation axis RX may increase. A direction in which the follower shaft 440 on the first ramp 271 moves along the slide rail 422 may be opposite to a direction of the elastic force applied by the clastic member 450 to the follower shaft 440. For example, the follower shaft 440 that moves along the first ramp 271 of the cam 26 rotating in the forward direction may move upward, and the elastic force applied by the clastic member 450 to the follower shaft 440 may be exerted downward. In order to rotate the stand cover 20 in the forward direction, a user may apply a torque greater than the elastic force of the elastic member 450. Accordingly, the user may manually rotate the stand cover 20 in a region from the first ramp 271 to the nose 280. That is, by rotating the stand cover 20 in the forward direction within a range of angles from zero degrees to the first angle θ1 with respect to the back cover 30, the user may manually unfold the stand cover 20.

Figure 15:
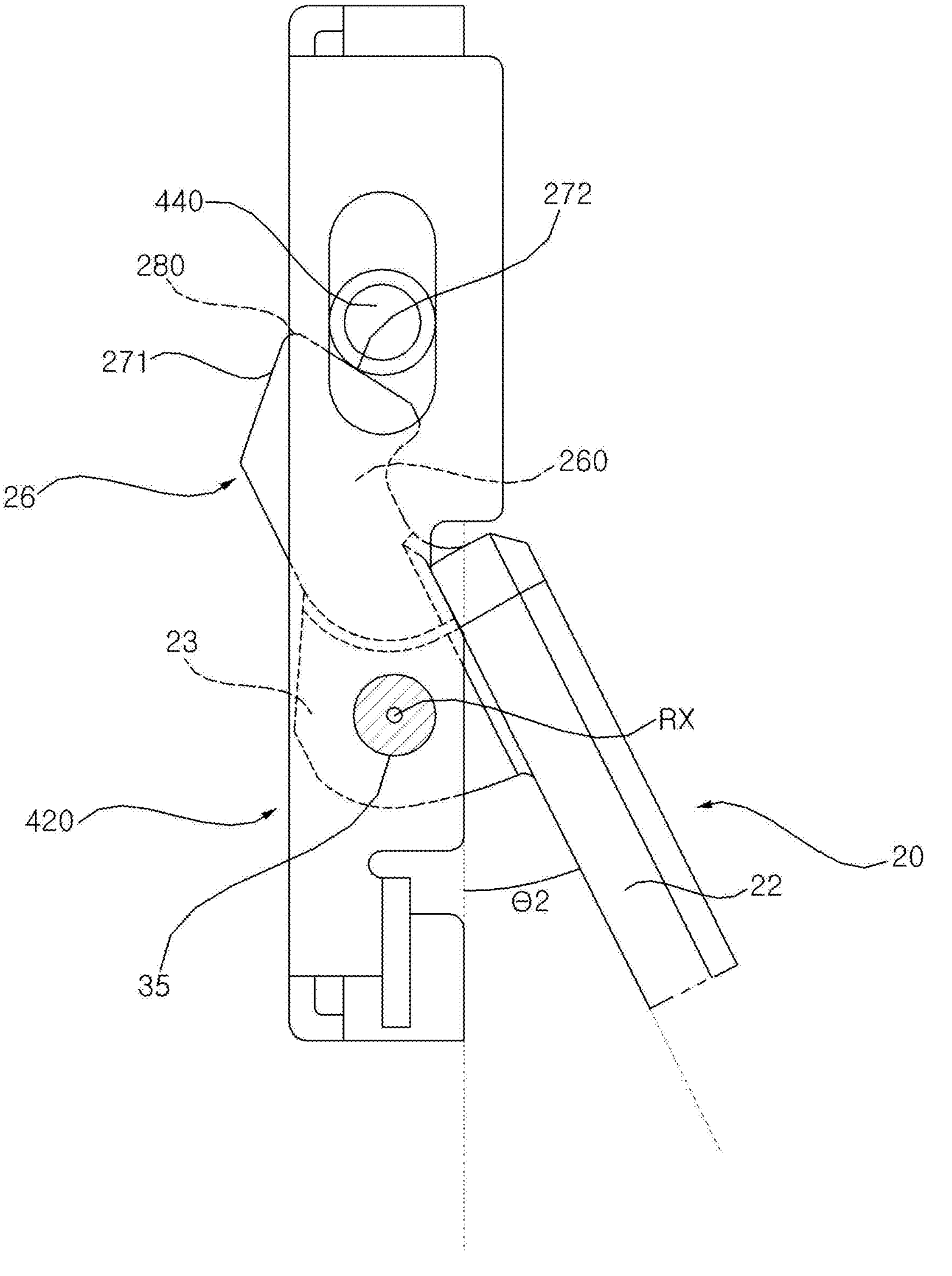

FIG. 15 is a diagram illustrating the follower shaft 440 when coming into contact with the second ramp 272.

Referring to FIGS. 14 and 15, a mechanism in which the stand cover 20 is automatically unfolded.

When the stand cover 20 rotates further in the forward direction, the follower shaft 440 which is in contact with the nose 280 as illustrated in FIG. 14 may contact the second ramp 272 as illustrated in FIG. 15. When the cam 26 rotates in the forward direction, the follower shaft 440 on the second ramp 272 may move downward. In addition, the follower shaft 440 may move along the second ramp 272 in a direction away from the nose 280. As the follower shaft 440 moves along the second ramp 272 in a direction away from the nose 280, a distance between the follower shaft 440 and the rotation axis RX may gradually decrease.

When the follower shaft 440 moves along the second ramp 272 as the stand cover 20 rotates in the forward direction, an angle at which the stand cover 20 is inclined with respect to the back cover 30 may gradually increase from the first angle θ1. When the stand cover 20 is unfolded, the stand cover 20 may form a second angle θ2 with respect to the back cover 30. The second angle θ2 may be a maximum angle formed between the stand cover 20 and the back cover 30. A region in which the follower shaft 440 moves along the second ramp 272 may correspond to an angle ranging from the first angle θ1 to the second angle θ2 at which the stand cover 20 is inclined with respect to the back cover 30.

As the distance between the follower shaft 440 and the rotation axis RX decreases, the elastic force applied by the elastic member 450 to the follower shaft 440 in a direction toward the rotation axis RX may decrease. A direction in which the follower shaft 440 on the second ramp 272 moves along the slide rail 422 may be correspond to a direction of the elastic force applied by the elastic member 450 to the follower shaft 440. For example, the follower shaft 440 that moves along the second ramp 272 of the cam 26 rotating in the forward direction may move downward, and the clastic force applied by the elastic member 450 to the follower shaft 440 may be exerted downward. When the follower shaft 440 is positioned on the second ramp, the cam 26 may rotate in the forward direction by the clastic force of the elastic member 450. Accordingly, a user may not apply a torque to rotate the stand cover 20 in the forward direction in the region of the second ramp 272. That is, when the stand cover 20 rotates in the forward direction within a range of angles from the first angle θ1 to the second angle θ2 with respect to the back cover 30, the stand cover 20 may automatically rotate in the forward direction.

The aforementioned operating principle of the stand cover 20 that rotates in the forward direction to be unfolded may also be applied to an operating principle of the stand cover 20 that rotates in the reverse direction to be folded. However, when the stand cover 20 rotates in the reverse direction to be folded, a manual area and an automatic area may be reversed compared to the case where the stand cover 20 rotates in the forward direction to be unfolded. That is, in order to rotate the stand cover 20 in the reverse direction, a user may be required to apply a torque, greater than the elastic force of the elastic member 450, to the stand cover 20. When the stand cover 20 rotates in the reverse direction within a range of angles from the first angle θ1 to the second angle θ2 with respect to the back cover 30, the user may manually fold the stand cover 20. In addition, when the stand cover 20 rotates in the reverse direction within a range of angles from zero degrees to the first angle θ1 with respect to the back cover 30, the stand cover 20 may automatically rotate in the reverse direction.

In order to fold the stand cover 20 that is unfolded, the user may be required to apply a torque, greater than or equal to the elastic force of the elastic member 450, to the stand cover 20. Accordingly, the stand cover 20 that is unfolded may remain in an unfolded state unless a torque greater than or equal to a threshold torque is applied thereto. That is, an angle at which the stand cover 20 is folded with respect to the back cover 30 by the elastic force of the elastic member 450 may be maintained.

Referring to FIGS. 16 to 19, another example of the stand cover 20 folded at various angles will be described below.

The cam 26 may include a plurality of noses 280. The nose 280 may include a first nose 281 and a second nose 282.

The ramp 270 may include a third ramp 273 extending from the second ramp 272 and a fourth ramp 274 extending from the third ramp 273. The first nose 281 may be disposed between the first ramp 271 and the second ramp 272, and the second nose 282 may be disposed between the third ramp 273 and the fourth ramp 274. The first nose 281 may be a connection part that connects the first ramp 271 and the second ramp 272. The second nose 282 may be a connection part that connects the third ramp 273 and the fourth ramp 274.

The third ramp 273 may be inclined so as to move away from the second nose 282 and closer to the rotation axis RX. The fourth ramp 274 may be inclined so as to move away from the second nose 282 and closer to the rotation axis RX. For example, the third ramp 273 may extend from the second nose 282 toward one end thereof and may be inclined to be closer to the rotation axis RX. For example, the fourth ramp 274 may extend from the second nose 282 toward another end thereof and may be inclined to be closer to the rotation axis RX.

Figure 16:
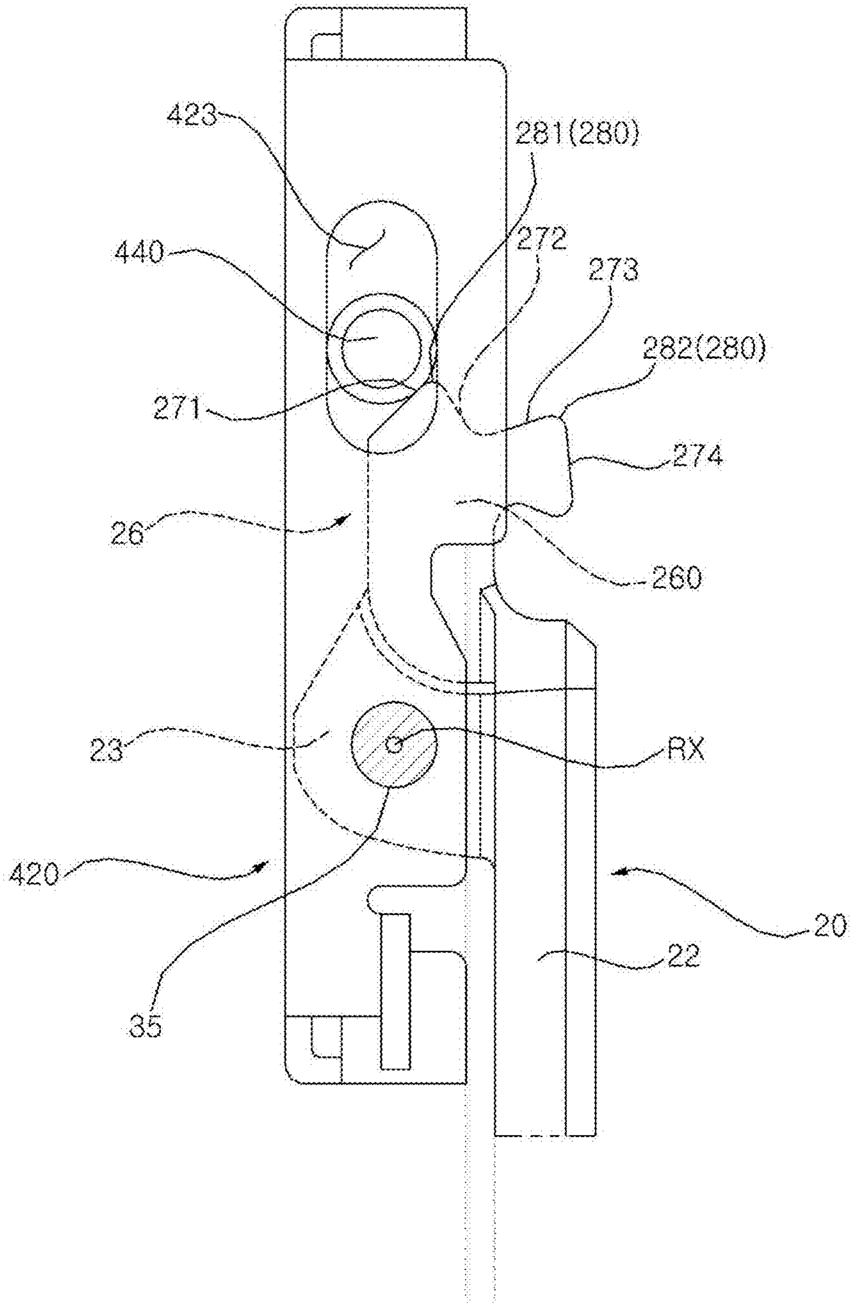
Figure 17:
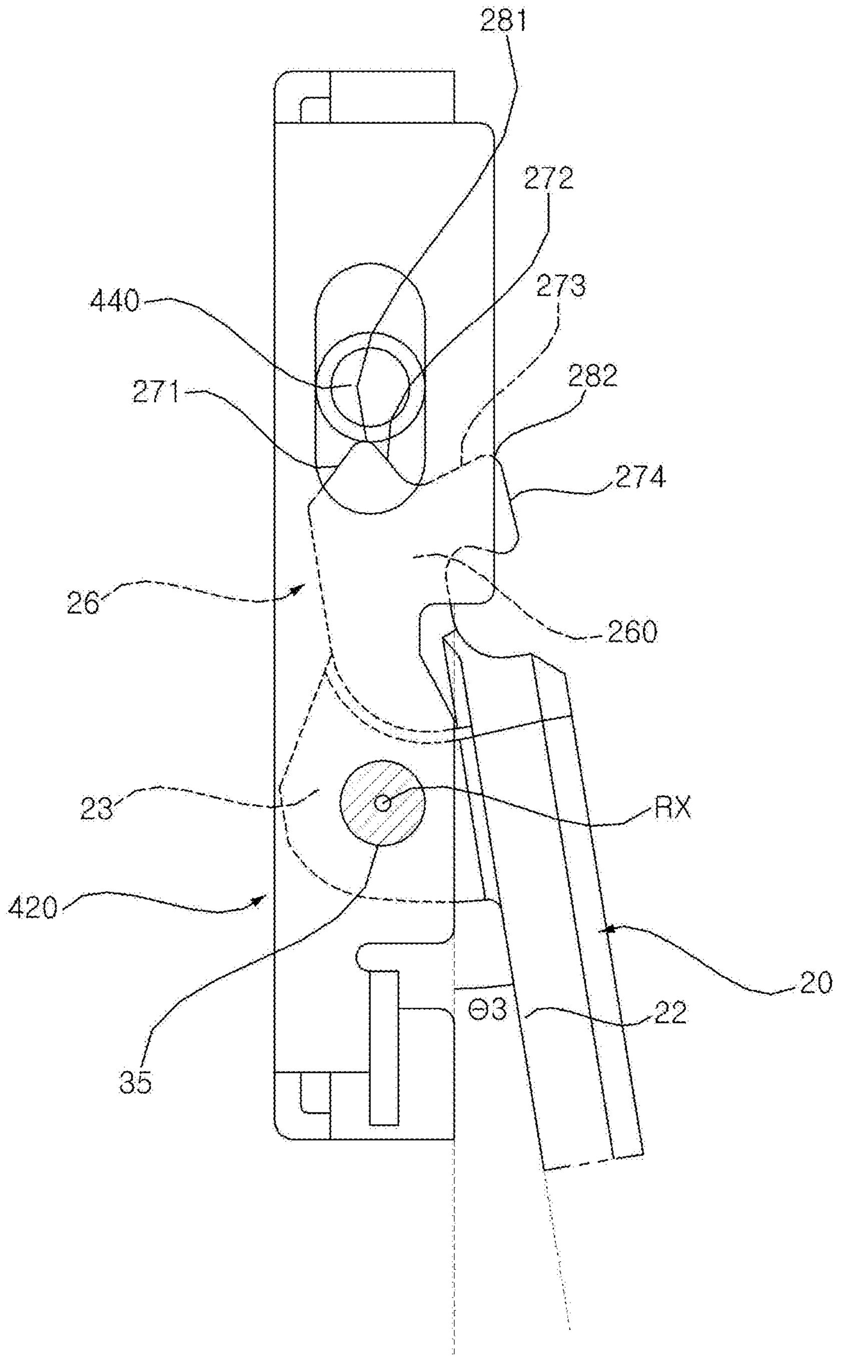

Referring to FIGS. 16 and 17, a mechanism of the stand cover 20 will be described below.

A description of a mechanism of manually unfolding the stand cover 20 in FIGS. 16 and 17 may be replaced by the description of the mechanism of manually unfolding the stand cover 20 in FIGS. 13 and 14. When the cam 26 rotates in the forward direction as the cover part 22 rotates in the forward direction, the follower shaft 440 may move along the first ramp 271 in a direction closer to the first nose 281. In this case, a direction in which the follower shaft 440 moves along the slide rail 422 is opposite to a direction of the elastic force applied by elastic member 250 to the follower shaft 440, such that when the follower shaft 440 is located on the first ramp 271, a user may be required to apply a driving force in order to unfold the stand cover 20. That is, when the follower shaft 440 is located on the first ramp 271, the user is required to manually unfold the stand cover 20.

When the follower shaft 440 is positioned at the first nose 281, the stand cover 20 may form a third angle θ3 with respect to the back cover 30. Accordingly, the user may manually rotate the stand cover 20 in the forward direction within a range of angles from zero degrees to the third angle θ3.

By contrast, in a mechanism of folding the stand cover 20, when the cam 26 rotates in the reverse direction as the cover part 22 rotates in the reverse direction, the follower shaft 440 may move along the first ramp 271 in a direction away from the first nose 281. In this case, a direction in which the follower shaft 440 moves along the slide rail 422 is parallel to a direction of the elastic force applied by the clastic member 450 to the follower shaft 440, such that when the follower shaft 440 is located on the first ramp 271, the stand cover 20 may be folded without a driving force provided by a user. That is, when the follower shaft 440 is located on the first ramp 271, the stand cover 20 may be automatically folded. The stand cover 20 that is unfolded may automatically rotate in the reverse direction within a range of angles from zero degrees to the third angle θ3.

Figure 18:
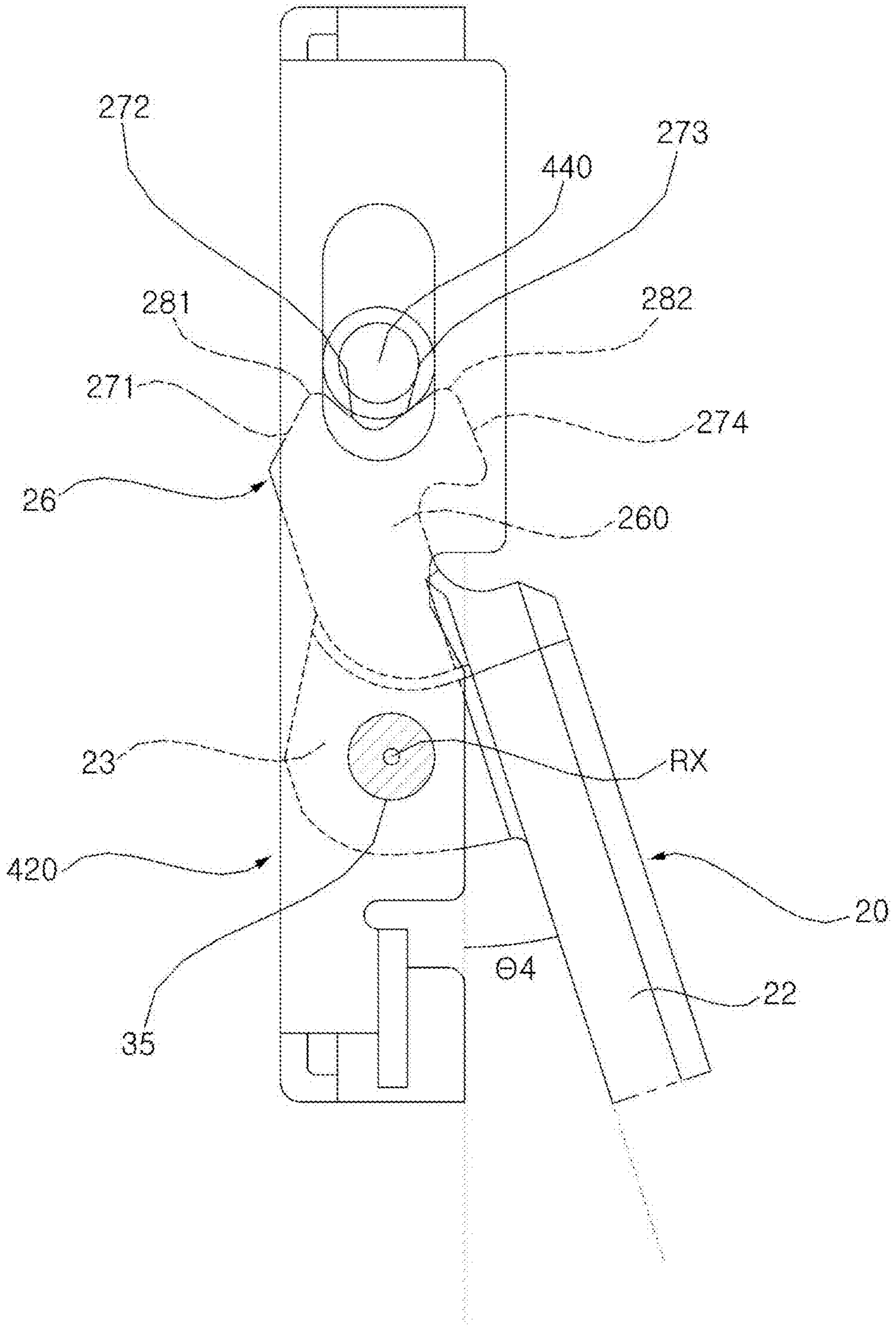

Referring to FIGS. 17 and 18, a mechanism of fixing the angle of the stand cover 20 will be described below.

A description of a mechanism of automatically unfolding the stand cover 20 in FIGS. 17 and 18 may be replaced by the description of the mechanism of automatically unfolding the stand cover 20 in FIGS. 14 and 15. When the cam 26 rotates in the forward direction as the cover part 22 rotates in the forward direction, the follower shaft 440 having passed through the first nose 281 may move along the second ramp 272 in a direction away from the first nose 281. In this case, a direction in which the follower shaft 440 moves along the slide rail 422 is parallel to a direction of the elastic force applied by the elastic member 450 to the follower shaft 440, such that when the follower shaft 440 is located on the second ramp 272, the stand cover 20 may be unfolded without a driving force provided by a user. That is, when the follower shaft 440 is located on the second ramp 272, the stand cover 20 may be automatically unfolded.

The follower shaft 440 may move along the second ramp 272 and may contact the third ramp 273. When the follower shaft 440 contacts the second ramp 272 and the third ramp 273, the automatic forward rotation of the stand cover 20 may be stopped. In this manner, an unfolding angle of the stand cover 20 may be fixed. When the follower shaft 440 contacts the second ramp 272 and the third ramp 273, the stand cover 20 may form a fourth angle θ4 with respect to the back cover 30. The stand cover 20 that is unfolded may automatically rotate in the forward direction within a range of angles from the third angle θ3 to the fourth angle θ4.

By contrast, in a mechanism of folding the stand cover 20, when the cam 26 rotates in the reverse direction as the cover part 22 rotates in the reverse direction, the follower shaft 440 may move along the second ramp 272 in a direction closer to the first nose 281. In this case, a direction in which the follower shaft 440 moves along the slide rail 422 is opposite to a direction of the elastic force applied by the elastic member 450 to the follower shaft 440, such that a user may be required to apply a driving force in order to fold the stand cover 20 when the follower shaft 440 is located on the second ramp 272. That is, when the follower shaft 440 is located on the second ramp 272, the user may be required to manually fold the stand cover 20. The user may manually rotate the unfolded stand cover 20 in the reverse direction within a range of angles from the third angle θ3 to the fourth angle θ4.

Figure 19:
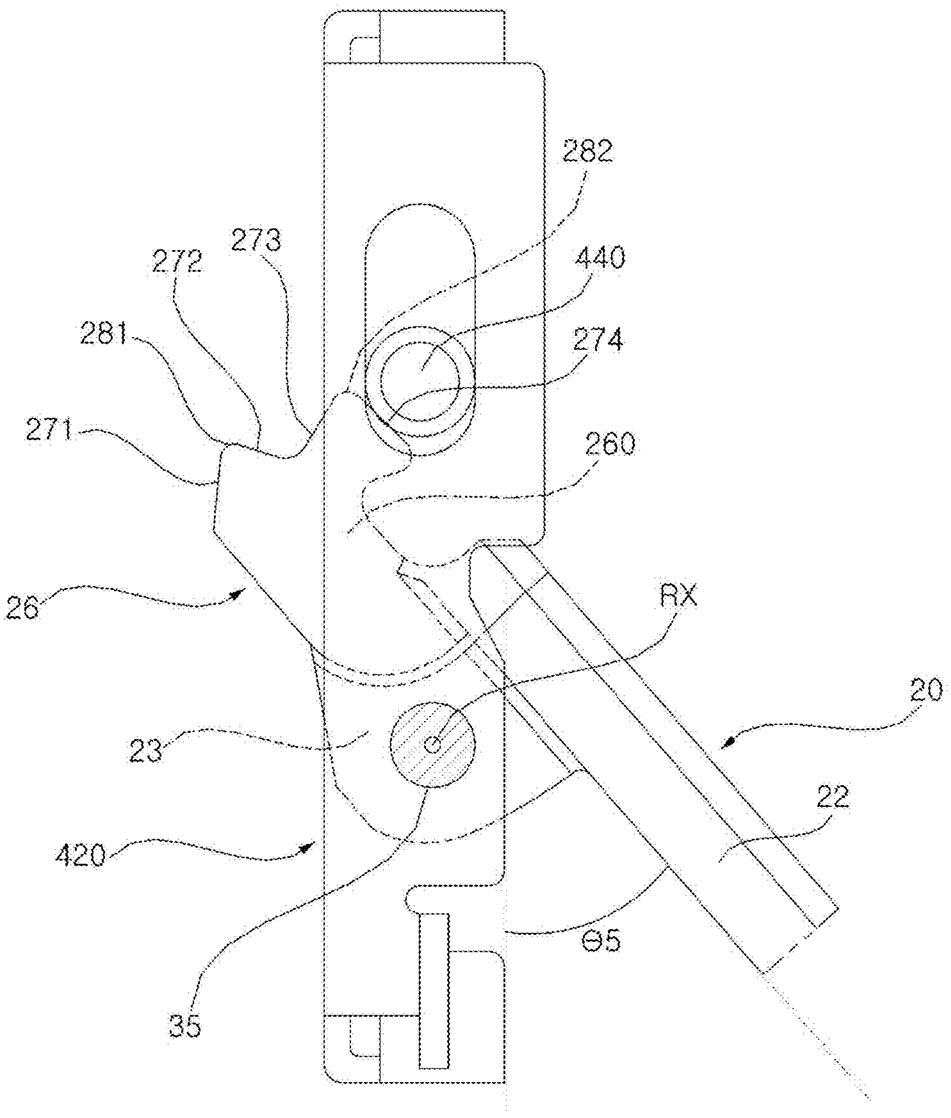

Referring to FIGS. 18 and 19, a mechanism of the stand cover 20 will be described below.

A description of a mechanism of unfolding the stand cover 20 in FIGS. 18 and 19 may be replaced by the description of the mechanism of unfolding the stand cover 20 in FIGS. 14 to 16. In brief, when the cam 26 rotates in the forward direction as the cover part 22 rotates in the forward direction, the follower shaft 440 may move along the third ramp 273 in a direction closer to the second nose 282. In this case, a direction in which the follower shaft 440 moves along the slide tail 422 is opposite to a direction of the elastic force applied to the follower shaft 440, such that a user may be required to apply a driving force in order to unfold the stand cover 20 when the follower shaft 440 is located on the third ramp 273. That is, when the follower shaft 440 is located on the third ramp 273, the user may be required to manually fold the stand cover 20.

By contrast, in the mechanism of folding the stand cover 20, when the cam 26 rotates in the reverse direction as the cover part 22 rotates in the reverse direction, the follower shaft 440 may move along the third ramp 273 in a direction away from the second nose 282. In this case, a direction in which the follower shaft 440 moves along the slide rail 422 is parallel to a direction of the elastic force applied to the follower shaft 440, such that when the follower shaft 440 is located on the third ramp 273, the stand cover 20 may be folded without a driving force provided by a user. That is, when the follower shaft 440 is located on the third ramp 273, the stand cover 20 may be automatically folded.

When the cam 26 rotates in the forward direction as the cover part 22 rotates in the forward direction, the follower shaft 440 having passed through the second nose 282 may move along the fourth ramp 274 in a direction away from the second nose 282. In this case, a direction in which the follower shaft 440 moves along the slide rail 422 is parallel to a direction of the elastic force applied to the follower shaft 440, such that when the follower shaft 440 is located on the fourth ramp 274, the stand cover 20 may be unfolded without a driving force provided by a user. That is, when the follower shaft 440 is located on the fourth ramp 274, the stand cover 20 may be automatically unfolded.

By contrast, in a mechanism of folding the stand cover 20, when the cam 26 rotates in the reverse direction as the cover part 22 rotates in the reverse direction, the follower shaft 440 may move along the fourth ramp 274 in a direction closer to the second nose 282. In this case, a direction in which the follower shaft 440 moves along the slide rail 422 is opposite to a direction of the elastic force applied to the follower shaft 440, such that when the follower shaft 440 is located on the fourth ramp 274, a user may be required to apply a driving force in order to fold the stand cover 20. That is, when the follower shaft 440 is located on the fourth ramp 274, a user may be required to manually fold the stand cover 20.

Figure 20:
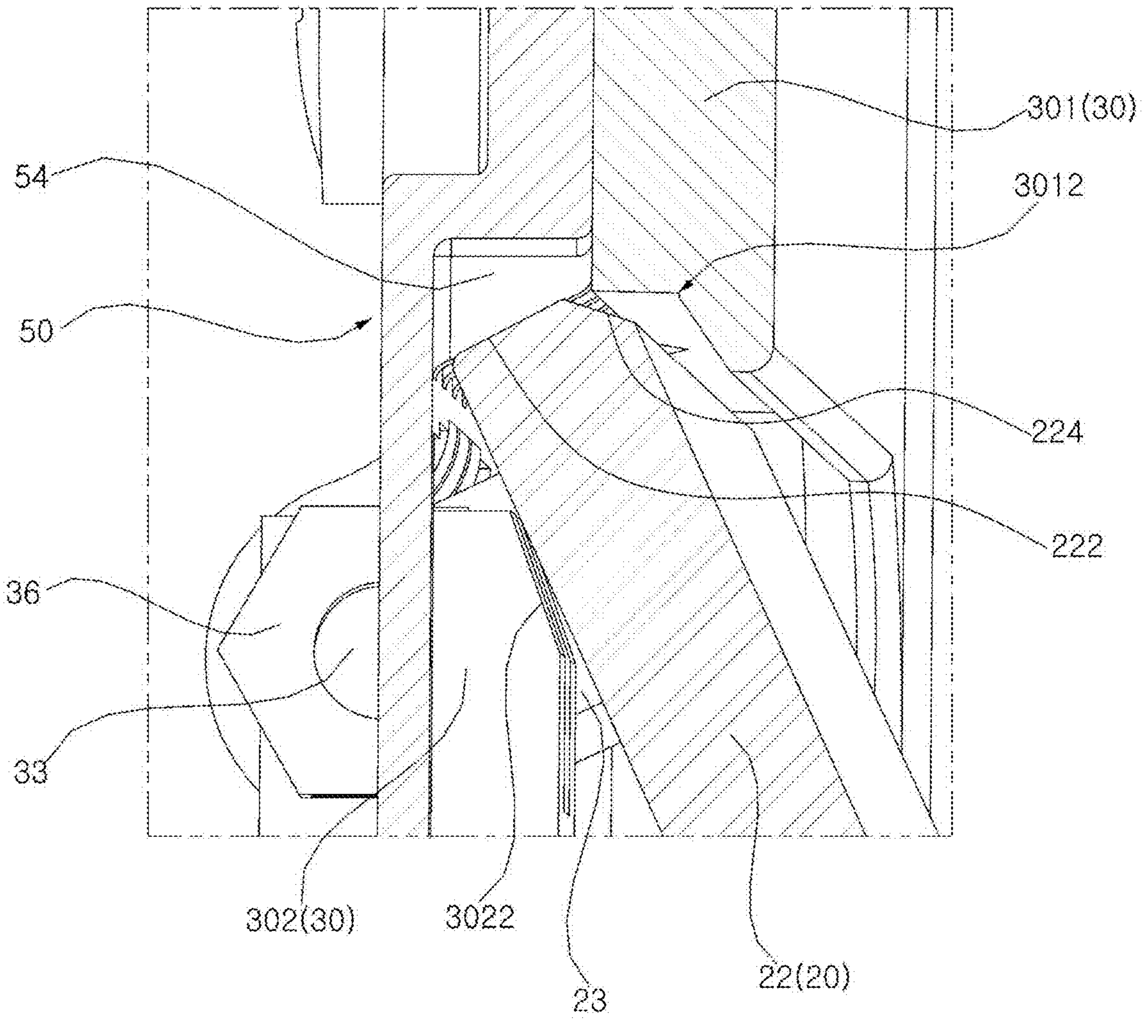

Referring to FIG. 20, the bracket 50 may include a stopper 54 for stopping the stand cover 20 from rotating at a predetermined angle or more.

The stopper 54 may be formed on one surface of the bracket 50 facing the back cover 30. The stopper 54 may contact the first long side 20A of the stand cover 20 that is unfolded. In this case, the stand cover 20 may be unfolded at a maximum angle. The stopper 54 may face the slit 37 formed in the back cover 30. The stopper 54 may be elongated toward the rotation axis RX. The stopper 54 may be spaced apart from the sub shaft 232. For example, the stopper 54 may be located above the sub shaft 232. The stopper 54 may be disposed in front of the first surface portion 301. The stopper 54 may be disposed above the second surface portion 302.

The slit 37 may be formed between the first surface portion 301 and the second surface portion 302. The slit 37 may be a groove formed between an upper end of the second surface portion 302 and the first surface portion 301 and elongated toward the rotation axis RX.

The back cover 30 may include a groove 3012 formed in an edge of the first surface portion 301 facing the slit 37. The groove 3012 may be recessed in a direction away from the rotation axis RX of the stand cover 20. The groove 2012 may be recessed in the edge of the first surface portion 301 that forms the slit 37. In this manner, a rotation space of the stand cover 20 may be secured. The stopper 54 may be disposed in front of the groove 3012. The stopper 54 may be spaced upward from an edge of the second surface portion 302 that forms the slit 37. The slit 37 may extend between the upper end of the second surface portion 302 and the stopper 54.

A corner of the first long side 20A of the stand cover 20 may be inclined. The stand cover 20 may have a chamfered surface 224 which is an inclined portion formed on the first long side 20A. The chamfered surface 224 may be formed by cutting off the corner of the first long side 20A. The chamfered surface 224 may be inclined at a rear corner of the first long side 20A. As the chambered surface 224 is formed on the first long side 20A, the stand cover 20 may rotate without interference with the first surface portion 301.

An upper corner of the second surface portion 302 may be inclined. The second surface portion 302 may have an inclined edge surface 3022 which is an inclined portion formed at the upper end of the second surface portion 302. The inclined edge surface 3022 may be formed by cutting off an upper corner of the second surface portion 302. The inclined edge surface 3022 may be formed at a rear corner of the upper end of the second surface portion 302. As the inclined edge surface is formed at the upper end of the second surface portion 302, the stand cover 20 may rotate without interference with the second surface portion 302.

Figure 21:
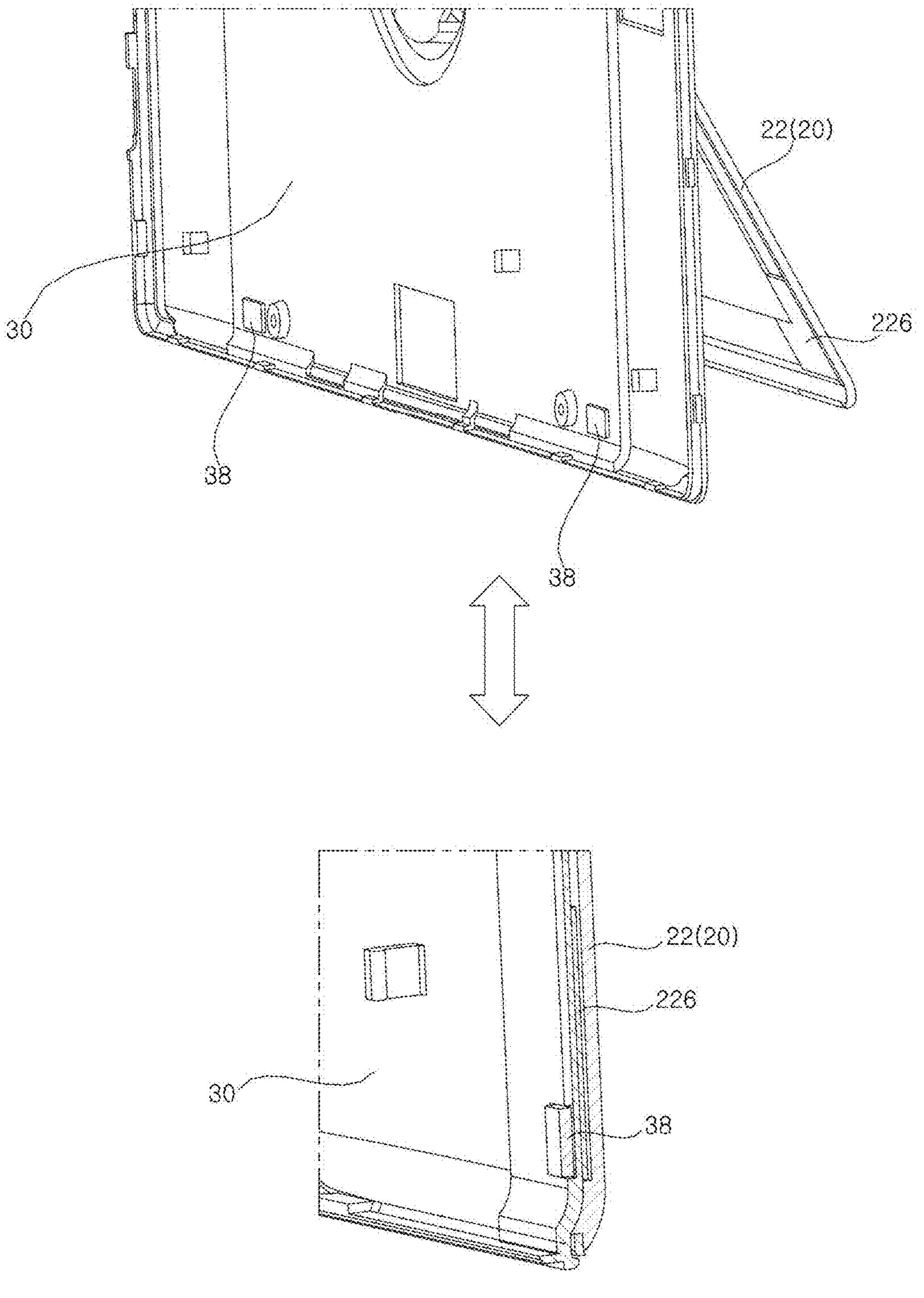

Referring to FIG. 21, a magnet 38 coupled to the back cover 30 and a plate 226 coupled to the stand cover 20 may be included.

The magnet 38 may be coupled to the rear surface of the back cover 30. The magnet 38 may be adjacent to the second long side 30B of the back cover 30. The magnet 38 may be a pair of magnets 38 which are disposed adjacent to the second long side 30B of the back cover 30 and spaced apart from each other in the left-right direction. The pair of magnets 38 may be coupled to a rear surface of the second surface portion 302. The pair of magnets 38 may be disposed at a lower corner of the second surface portion 302.

The plate 226 may be made of a metal material. The plate 226 may be coupled to the rear surface of the stand cover 20. The plate 226 may be disposed between the stand cover 20 and the second surface portion 302. The plate 226 may be adjacent to the second long side 20B of the stand cover 20. The plate 226 may be disposed at a lower corner of the stand cover 20. The lower corner of the stand cover 20 may include a corner portion at which the second long side 20B disposed at the bottom and the first short side 20C disposed at the left meet each other, and a corner portion at which the second long side 20B disposed at the bottom and the second short side 20D disposed at the right meet each other. The plate 226 may include a pair of plates 226 disposed at the lower corner of the stand cover 20. When the stand cover 20 is folded, a position of the magnet 38 may correspond to a position of the plate 226. That is, when the stand cover 20 is folded, the magnet 38 and the plate 226 may overlap in a front-rear direction.

An attractive force may act between the magnet 38 and the plate 226. When the stand cover 20 is folded, the stand cover 20 may come into close contact with the second surface portion 302 by the attractive force acting between the magnet 38 and the plate 226. When the follower shaft 440 moves on the first ramp 271 in a direction away from the first nose 281, the stand cover 20 may automatically move to the second surface portion 302 by the elastic force. The stand cover 20 that is automatically folded may come into close contact with the second surface portion 302 by the attractive force acting between the magnet 38 and the plate 226.

Referring to FIGS. 1 to 21, a display device 1 may include: a display panel 11; a back cover 30 disposed at a rear of the display panel 11 and coupled to the display panel 11; a stand cover 20 rotatably coupled to the back cover 30; an elastic member 450 extending in a direction intersecting a rotation axis RX of the stand cover 20, and having one end fixed to the back cover 30; and a follower shaft 440 fixed to the other end of the clastic member 450 and movable in a longitudinal direction of the elastic member 450, wherein the stand cover 20 includes: a shaft 23 extending toward the rotation axis RX and rotating about the rotation axis RX; and a cam 26 integrally rotating with the shaft 23 to move the follower shaft 440, and including a ramp 270 that contacts the follower shaft 440, wherein the ramp 270 includes a nose 280 protruding from the shaft 23 in a direction intersecting the rotation axis RX, the nose 280 being spaced apart from the rotation axis RX by a distance that increases and then decreases in a rotation direction of the rotation axis RX.

The ramp 270 may include a first ramp 271 extending from the nose 280 toward one end of the ramp 270, with a distance between the first ramp 271 and the rotation axis RX decreasing in a direction away from the nose 280; and a second ramp 272 extending from the nose 280 toward the other end of the ramp 270, with a distance between the second ramp 272 and the rotation axis RX decreasing in a direction away from the nose 280.

The nose 280 may connect the first ramp 271 and the second ramp 272 in a curved manner.

The first ramp 271 and the second ramp 272 may extend flatly from the nose 280.

The follower shaft 440 may be a bar having a circular cross-section.

The shaft 23 may include: a cam shaft 234 connected to the cam 26 and rotatably coupled to the back cover 30; and a pair of sub shafts 232 spaced apart from each other in an axial direction of the rotation axis RX.

The cam shaft 234 may be disposed between the pair of sub shafts 232.

The display device 1 may further include a case 420 in which the cam 26 is received, and which is case 420 coupled to the back cover 30.

The case 420 may include a slide rail 422 on which the follower shaft 440 is movably disposed, and extending from the rotation axis RX toward the follower shaft 440.

The case 420 may include an opening 428 that opens forward, wherein a width W2 of the opening 428 in a direction of the rotation axis RX of the stand cover 20 may be greater than a width W1 of the cam 26 in the direction of the rotation axis RX of the stand cover 20.

The case 420 may include a fixing part 425 to which one end of the elastic member 450 is fixed, and wherein the other end of the elastic member 450 may be fixed to an end of the follower shaft 440 that protrudes from the case 420.

The stand cover 20 may include one side extending in the axial direction of the rotation axis RX of the stand cover 20, and adjacent to the rotation axis RX.

The back cover 30 may include a slit 37 in which one side of the stand cover 20, when the stand cover 20 rotated to its maximum angle, is disposed.

The display device 1 may include a bracket 50 disposed at a front of the back cover 30 and coupled to the back cover 30.

The bracket 50 may include a stopper 54 contacting the one side of the stand cover 20 when the stand cover 20 is rotated to its maximum angle.

The back cover 30 may include: a first surface portion 301 facing rearward; and a second surface portion 302 recessed from the first surface portion 301 to form a stand receiving portion 320.

A surface of the stand cover 20, which is in contact with the second surface portion 302, may be disposed parallel to the first surface portion 301.

The ramp 270 may include: a third ramp 273 extending from the second ramp 272 toward the other end of the ramp 270, with a distance between the third ramp 273 and the rotation axis RX increasing in a direction away from the second ramp 272; and a fourth ramp 274 extending from the third ramp 273 toward the other end of the ramp 270, with a distance between the fourth ramp 274 and the rotation axis RX decreasing in a direction away from the third ramp 273.

The nose 280 may include a first nose 281 connecting the first ramp 271 and the second ramp 272; and a second nose 282 connecting the third ramp 273 and the fourth ramp 274.

The display device 1 may include: a magnet 38 coupled to the back cover 30; and a plate 226 coupled to the stand cover 20, with an attractive force acting between the plate 226 and the magnet 38.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

What is claimed is:

1. A display device comprising:

a display panel;

a back cover coupled to the display panel and being located at a rear side of the display panel;

a stand cover rotatably coupled to the back cover and being structured to rotate about a rotation axis;

an elastic member having a first end and a second end, wherein the elastic member extends in a direction that intersects the rotation axis of the stand cover, and the first end is coupled to the back cover; and a follower shaft coupled to the second end of the elastic member and is structured to be movable in a longitudinal direction of the elastic member, wherein the stand cover comprises:

a shaft extending toward the rotation axis and is structured to rotate about the rotation axis; and a cam integrally rotating with the shaft to move the follower shaft, wherein the cam includes a ramp that contacts the follower shaft, and wherein the ramp comprises a nose protruding in a direction intersecting the rotation axis, wherein a distance between the follower shaft and the rotation axis increases and then decreases as the follower shaft moves along the ramp over the nose during rotation of the stand cover, wherein the ramp comprises:

a first ramp portion extending from the nose toward one end of the ramp, with a distance between the first ramp portion and the rotation axis decreasing in a direction away from the nose; and a second ramp portion extending from the nose toward another end of the ramp, with a distance between the second ramp portion and the rotation axis decreasing in a direction away from the nose.

2. The display device of claim 1, wherein the nose is shaped to define a curve portion that connects the first ramp portion and the second ramp portion.

3. The display device of claim 1, wherein the first ramp portion and the second ramp portion respectively extend from the nose in a substantially straight direction.

4. The display device of claim 1, wherein the follower shaft is a bar having a circular cross-section.

5. The display device of claim 1, wherein the shaft comprises:

a cam shaft connected to the cam and rotatably coupled to the back cover; and a pair of sub shafts spaced apart from each other in an axial direction of the rotation axis, wherein the cam shaft is disposed between the pair of sub shafts.

6. The display device of claim 1, further comprising a case that is sized to receive the cam, wherein the case is coupled to the back cover, and wherein the case comprises a slide rail that is structured to receive the follower shaft to permit movement of the follower shaft, wherein the slide rail extends in a direction away from the rotation axis.

7. The display device of claim 6, wherein the case is structured to define an opening that faces forward, wherein a width of the opening in a direction of the rotation axis of the stand cover is greater than a width of the cam in the direction of the rotation axis of the stand cover.

8. The display device of claim 6, wherein the case comprises a fixing part to which the first end of the elastic member is coupled to, and wherein the second end of the elastic member is coupled to an end of the follower shaft that protrudes from the case.

9. The display device of claim 1, wherein the stand cover comprises one side extending in an axial direction of the rotation axis of the stand cover, and is adjacent to the rotation axis, and wherein the back cover is shaped to define a slit in which one side of the stand cover is located when the stand cover is rotated to a maximum rotation angle.

10. The display device of claim 9, further comprising a bracket disposed at a front side of the back cover and being coupled to the back cover, wherein the bracket comprises a stopper contacting the one side of the stand cover when the stand cover is rotated to the maximum rotation angle.

11. The display device of claim 9, wherein the back cover comprises:

a first surface portion facing rearward; and a second surface portion recessed from the first surface portion to form a stand receiving portion, and wherein a surface of the stand cover, which is in contact with the second surface portion, is disposed parallel to the first surface portion.

12. The display device of claim 1, wherein the ramp comprises:

a third ramp portion extending from the second ramp portion toward the another end of the ramp, with a distance between the third ramp portion and the rotation axis increasing in a direction away from the second ramp portion; and a fourth ramp portion extending from the third ramp portion toward the another end of the ramp, with a distance between the fourth ramp portion and the rotation axis decreasing in a direction away from the third ramp portion, and wherein the nose comprises:

a first nose portion connecting the first ramp portion and the second ramp portion; and a second nose portion connecting the third ramp portion and the fourth ramp portion.

13. The display device of claim 1, further comprising:

a magnet coupled to the back cover; and a plate coupled to the stand cover, with an attractive force acting between the plate and the magnet.

14. A display device comprising:

a display panel;

a back cover coupled to a rear side of the display panel;

a stand cover rotatably coupled to the back cover and being structured to rotate about a rotation axis;

an elastic member having a first end and a second end, wherein the elastic member extends in a direction that is perpendicular to the rotation axis of the stand cover, wherein the first end is coupled to the back cover; and a follower shaft coupled to the second end of the elastic member, wherein the follower shaft is structured to be moved in reciprocal linear directions;

wherein the stand cover comprises:

a first portion structured to rotate about the rotation axis; and a cam integrally rotating with the first portion and being structed to cause the follower shaft to move according to the rotation of the stand cover, wherein the cam includes a ramp that contacts the follower shaft, wherein the ramp comprises a nose that is located at an end portion of the ramp, and wherein a distance between the follower shaft and the rotation axis changes as the follower shaft moves along the ramp over the nose during rotation of the stand cover, wherein the ramp comprises:

a first ramp portion extending from the nose in a first direction; and a second ramp portion extending from the nose in a second direction, wherein the follower shaft sequentially moves along the first ramp portion, the nose, and the second ramp portion, based on the stand cover being rotated in a first direction, and wherein the follower shaft sequentially moves along the second ramp portion, the nose, and the first ramp portion, based on the stand cover being rotated in second direction that is opposite that of the first direction.

15. The display device of claim 14, wherein a distance of the follower shaft relative to the rotation axis of the stand cover is greater when the follower shaft contacts the nose of the ramp, as compared to the distance when the follower shaft contacts either the first ramp portion or the second ramp portion.

* * * * *